United States Patent
Dean et al.

(10) Patent No.: US 10,013,033 B2
(45) Date of Patent: Jul. 3, 2018

(54) ELECTRONIC ASSEMBLY WITH THERMAL CHANNEL AND METHOD OF MANUFACTURE THEREOF

(71) Applicant: SanDisk Technologies LLC, Plano, TX (US)

(72) Inventors: David L. Dean, Litchfield Park, AZ (US); Dennis Bennett, Gilbert, AZ (US); Robert W. Ellis, Phoenix, AZ (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/596,176

(22) Filed: Jan. 13, 2015

(65) Prior Publication Data

US 2015/0124397 A1  May 7, 2015

Related U.S. Application Data

(63) Continuation of application No. PCT/US2014/043146, filed on Jun. 19, 2014, which
(Continued)

(51) Int. Cl.
*G06F 1/20* (2006.01)
*H05K 1/14* (2006.01)
(Continued)

(52) U.S. Cl.
CPC .......... *G06F 1/20* (2013.01); *H05K 1/14* (2013.01); *H05K 1/141* (2013.01); *H05K 1/142* (2013.01);
(Continued)

(58) Field of Classification Search
CPC .......... H05K 7/14–7/186; H05K 7/205; H05K 7/20509; H05K 1/14–1/148; H05K 2201/047; H07K 3/007
(Continued)

(56) References Cited

U.S. PATENT DOCUMENTS

| 4,519,016 A | 5/1985 | Bradley et al. |
| 4,839,587 A | 6/1989 | Flatley et al. |

(Continued)

FOREIGN PATENT DOCUMENTS

| CN | 201230432 | 4/2009 |
| CN | 201 655 782 | 11/2010 |

(Continued)

OTHER PUBLICATIONS

International Search Report and Written Opinion dated May 18, 2015, received in International Patent Application No. PCT/US2015/016656, which corresponds to U.S. Appl. No. 14/275,690, 14 pages (Wright).

(Continued)

*Primary Examiner* — Dimary Lopez Cruz
*Assistant Examiner* — Zhengfu Feng
(74) *Attorney, Agent, or Firm* — Morgan, Lewis & Bockius LLP

(57) ABSTRACT

In accordance with some implementations of this invention, an electronic assembly is formed with a thermal channel that controls an air flow for the purpose of dissipating heat generated in the electronic assembly. The electronic assembly includes a top board, a bottom board and a subassembly that further includes a rail, an airflow tab and an interconnect. The subassembly couples the top and bottom boards together. The rail has an opening through which air passes. The interconnect faces the airflow tab, carries electrical signals between the top board and the bottom board, and is configured to channel air directed through the opening of the rail.

24 Claims, 11 Drawing Sheets

Related U.S. Application Data is a continuation-in-part of application No. 13/922,136, filed on Jun. 19, 2013, now Pat. No. 9,898,056.

(60) Provisional application No. 61/946,732, filed on Mar. 1, 2014.

(51) Int. Cl.
  H05K 7/14 (2006.01)
  H05K 7/20 (2006.01)

(52) U.S. Cl.
  CPC .............. *H05K 1/144* (2013.01); *H05K 1/145* (2013.01); *H05K 1/147* (2013.01); *H05K 1/148* (2013.01); *H05K 7/14* (2013.01); *H05K 7/20145* (2013.01); *Y10T 29/49002* (2015.01); *Y10T 29/49117* (2015.01)

(58) Field of Classification Search
  USPC .............. 361/679.31–679.33, 679.37–679.39, 361/679.46, 679.54, 679.49, 693, 694; 29/592.1; 324/757.01
  See application file for complete search history.

(56) References Cited

U.S. PATENT DOCUMENTS

| | | | |
|---|---|---|---|
| 5,210,680 A | 5/1993 | Scheibler | |
| 5,334,798 A * | 8/1994 | Kalis | H01R 23/6873 174/250 |
| 5,489,805 A | 2/1996 | Hackitt et al. | |
| 5,628,031 A | 5/1997 | Kikinis et al. | |
| 5,705,850 A | 1/1998 | Ashiwake et al. | |
| 5,763,950 A | 6/1998 | Fujisaki et al. | |
| 5,828,549 A | 10/1998 | Gandre et al. | |
| 5,923,532 A | 7/1999 | Nedved | |
| 5,946,190 A | 8/1999 | Patel et al. | |
| 5,973,920 A * | 10/1999 | Altic | G06F 1/203 165/80.2 |
| 6,008,987 A | 12/1999 | Gale et al. | |
| 6,009,938 A | 1/2000 | Smith et al. | |
| 6,031,730 A | 2/2000 | Kroske | |
| 6,058,012 A | 5/2000 | Cooper et al. | |
| 6,061,245 A | 5/2000 | Ingraham et al. | |
| 6,084,773 A | 7/2000 | Nelson et al. | |
| 6,335,862 B1 | 1/2002 | Koya | |
| 6,411,511 B1 | 6/2002 | Chen | |
| 6,507,101 B1 | 1/2003 | Morris | |
| 6,528,878 B1 | 3/2003 | Daikoku et al. | |
| 6,541,310 B1 | 4/2003 | Lo et al. | |
| 6,570,762 B2 | 5/2003 | Cross et al. | |
| 6,618,249 B2 | 9/2003 | Fairchild | |
| 6,621,705 B1 | 9/2003 | Ballenger et al. | |
| 6,715,018 B2 * | 3/2004 | Farnworth | G06F 1/184 710/100 |
| 6,762,942 B1 | 7/2004 | Smith | |
| 6,892,801 B1 | 5/2005 | Kim | |
| 6,934,152 B1 | 8/2005 | Barrow | |
| 6,997,720 B2 | 2/2006 | Perret et al. | |
| 7,030,482 B2 | 4/2006 | Haines | |
| 7,075,788 B2 | 7/2006 | Larson et al. | |
| 7,079,972 B1 | 7/2006 | Wood et al. | |
| 7,233,501 B1 | 6/2007 | Ingalz | |
| 7,280,364 B2 | 10/2007 | Harris et al. | |
| 7,442,050 B1 * | 10/2008 | Bhakta | H05K 1/147 439/71 |
| 7,474,528 B1 | 1/2009 | Olesiewicz | |
| 7,480,147 B2 | 1/2009 | Hoss et al. | |
| 7,595,994 B1 | 9/2009 | Sun | |
| 7,599,182 B2 | 10/2009 | Sun | |
| 7,623,343 B2 | 11/2009 | Chen | |
| 7,959,445 B1 | 6/2011 | Daily et al. | |
| 7,961,462 B2 | 6/2011 | Hernon | |
| 7,980,863 B1 | 7/2011 | Holec et al. | |
| 7,989,709 B2 | 8/2011 | Tsao | |
| 8,000,096 B2 | 8/2011 | Nemoz et al. | |
| 8,116,079 B2 * | 2/2012 | Merrow | G11B 33/142 165/121 |
| 8,198,539 B2 | 6/2012 | Otoshi et al. | |
| 8,208,252 B2 | 6/2012 | Tolliver | |
| 8,305,103 B2 | 11/2012 | Kang et al. | |
| 8,373,986 B2 | 2/2013 | Sun | |
| 8,405,985 B1 | 3/2013 | Reynov et al. | |
| 8,472,183 B1 | 6/2013 | Ross et al. | |
| 8,477,495 B2 | 7/2013 | Sun | |
| 8,570,740 B2 | 10/2013 | Cong et al. | |
| 8,599,560 B2 | 12/2013 | Wu et al. | |
| 9,089,073 B2 | 7/2015 | Reynov et al. | |
| 2002/0008963 A1 | 1/2002 | DiBene, II et al. | |
| 2002/0076951 A1 | 6/2002 | Roy | |
| 2002/0123259 A1 * | 9/2002 | Yatskov | H01R 12/62 439/329 |
| 2002/0162039 A1 * | 10/2002 | Kirker | G06F 1/26 713/330 |
| 2003/0184970 A1 | 10/2003 | Bosch et al. | |
| 2004/0059850 A1 | 3/2004 | Hipp | |
| 2004/0218367 A1 * | 11/2004 | Lin | H05K 1/144 361/721 |
| 2004/0229480 A1 * | 11/2004 | Haba | H05K 1/147 439/67 |
| 2004/0246662 A1 | 12/2004 | Thurk et al. | |
| 2005/0009382 A1 | 1/2005 | Burmeister et al. | |
| 2005/0013120 A1 | 1/2005 | Liu | |
| 2005/0082663 A1 | 4/2005 | Wakiyama et al. | |
| 2005/0152112 A1 | 7/2005 | Holmes et al. | |
| 2006/0042291 A1 | 3/2006 | Petroski | |
| 2006/0067054 A1 | 3/2006 | Wang et al. | |
| 2006/0067066 A1 * | 3/2006 | Meier | G06F 1/184 361/785 |
| 2006/0133041 A1 | 6/2006 | Belady et al. | |
| 2007/0001282 A1 | 1/2007 | Kang et al. | |
| 2007/0057686 A1 | 3/2007 | Suga et al. | |
| 2007/0074850 A1 | 4/2007 | Peschl | |
| 2007/0097653 A1 | 5/2007 | Gilliland et al. | |
| 2007/0121297 A1 | 5/2007 | Uchizono et al. | |
| 2007/0145996 A1 | 6/2007 | Shiao et al. | |
| 2007/0211426 A1 | 9/2007 | Clayton et al. | |
| 2007/0211436 A1 | 9/2007 | Robinson et al. | |
| 2007/0216005 A1 | 9/2007 | Yim et al. | |
| 2007/0216009 A1 | 9/2007 | Ng | |
| 2007/0230111 A1 | 10/2007 | Starr et al. | |
| 2007/0246189 A1 | 10/2007 | Lin et al. | |
| 2007/0247805 A1 | 10/2007 | Fujie et al. | |
| 2007/0293954 A1 * | 12/2007 | Pfingsten | H01R 13/514 700/22 |
| 2008/0019095 A1 | 1/2008 | Liu | |
| 2008/0026637 A1 | 1/2008 | Minich | |
| 2008/0037218 A1 * | 2/2008 | Sharma | H05K 7/1424 361/695 |
| 2008/0043435 A1 | 2/2008 | Yip et al. | |
| 2008/0052435 A1 * | 2/2008 | Norwood | H05K 7/1467 710/301 |
| 2008/0068796 A1 | 3/2008 | Pay et al. | |
| 2008/0116571 A1 | 5/2008 | Dang et al. | |
| 2008/0158818 A1 | 7/2008 | Clidaras et al. | |
| 2008/0236791 A1 | 10/2008 | Wayman | |
| 2008/0252324 A1 | 10/2008 | Barabi et al. | |
| 2008/0254573 A1 | 10/2008 | Sir et al. | |
| 2008/0266807 A1 | 10/2008 | Lakin et al. | |
| 2008/0291636 A1 | 11/2008 | Mori et al. | |
| 2009/0190308 A1 | 7/2009 | Bhattacharya et al. | |
| 2009/0273898 A1 | 11/2009 | Imsand | |
| 2009/0302458 A1 | 12/2009 | Kubo et al. | |
| 2009/0309214 A1 | 12/2009 | Szewerenko et al. | |
| 2010/0008034 A1 * | 1/2010 | Hinkle | G06F 1/20 361/679.31 |
| 2010/0073860 A1 | 3/2010 | Moriai et al. | |
| 2010/0073880 A1 | 3/2010 | Liu | |
| 2010/0091463 A1 | 4/2010 | Buresch et al. | |
| 2010/0118496 A1 | 5/2010 | Lo | |
| 2010/0164525 A1 | 7/2010 | Han et al. | |
| 2010/0224985 A1 | 9/2010 | Michael et al. | |
| 2010/0328887 A1 | 10/2010 | Refai-Ahmed et al. | |

(56) References Cited

U.S. PATENT DOCUMENTS

| | | |
|---|---|---|
| 2010/0296255 A1 | 11/2010 | Maloney |
| 2010/0319986 A1 | 12/2010 | Bleau et al. |
| 2011/0132000 A1 | 6/2011 | Deane et al. |
| 2011/0182035 A1 | 7/2011 | Yajima |
| 2011/0188205 A1 | 8/2011 | MacManus et al. |
| 2011/0299244 A1 | 12/2011 | Dede et al. |
| 2011/0317359 A1 | 12/2011 | Wei et al. |
| 2012/0014067 A1 | 1/2012 | Siracki |
| 2012/0064781 A1 | 3/2012 | Krishnan et al. |
| 2012/0170224 A1 | 7/2012 | Fowler et al. |
| 2012/0201007 A1 | 8/2012 | Yeh et al. |
| 2012/0293962 A1 | 11/2012 | McCluskey et al. |
| 2012/0327598 A1 | 12/2012 | Nakayama |
| 2013/0155800 A1 | 6/2013 | Shim et al. |
| 2013/0181733 A1 | 7/2013 | Kikuchi et al. |
| 2013/0192887 A1* | 8/2013 | Yaguchi ............... H01B 7/0823 174/262 |
| 2013/0285686 A1 | 10/2013 | Malik et al. |
| 2013/0294028 A1 | 11/2013 | Lafont et al. |
| 2013/0307060 A1 | 11/2013 | Wang et al. |
| 2014/0055944 A1 | 2/2014 | McCabe et al. |
| 2014/0071614 A1 | 3/2014 | Kaldani |
| 2014/0153181 A1 | 6/2014 | Peng et al. |
| 2014/0182814 A1 | 7/2014 | Lin |

FOREIGN PATENT DOCUMENTS

| | | |
|---|---|---|
| CN | 102393768 | 3/2012 |
| CN | 102 446 873 | 5/2012 |
| DE | 199 10 500 A1 | 10/2000 |
| DE | 2005 063281 | 7/2007 |
| EP | 0 600 590 A1 | 6/1994 |
| EP | 0 989 794 A2 | 3/2000 |
| EP | 2 066 158 A2 | 6/2009 |
| EP | 2 395 827 A2 | 12/2011 |
| EP | 2 600 700 A1 | 6/2013 |
| FR | 2560731 | 9/1985 |
| JP | 06006064 | 1/1994 |
| JP | 2003 188565 | 7/2003 |
| WO | WO 1988 07193 | 3/1988 |
| WO | WO 2003/094586 A | 11/2003 |
| WO | WO 2004/086827 A2 | 10/2004 |
| WO | WO 2008/013850 A2 | 1/2008 |
| WO | WO 2013/080341 | 6/2013 |

OTHER PUBLICATIONS

International Search Report and Written Opinion dated May 28, 2015, received in International Patent Application No. PCT/US2015/017729, which corresponds to U.S. Appl. No. 14/244,745, 14 pages (Ellis).

International Search Report and Written Opinion dated Dec. 16, 2014, received in International Patent Application No. PCT/US2014/059114, which corresponds to U.S. Appl. No. 14/135,223, 9 pages (Dean).

Invitation to Pay Additional Fees dated Jul. 25, 2014, received in International Patent Application No. PCT/US2014/021290, which corresponds to U.S. Appl. No. 13/791,797, 8 pages (Dean).

International Search Report and Written Opinion dated Nov. 20, 2014, received in International Patent Application No. PCT/US2014/020290, which corresponds to U.S. Appl. No. 13/791,797, 21 pages (Dean).

International Search Report and Written Opinion dated Dec. 23, 2014, received in International Patent Application No. PCT/US2014/042772, which corresponds to U.S. Appl. No. 13/922,105, 10 pages (Dean).

International Search Report and Written Opinion dated Sep. 12, 2014, received in International Patent Application No. PCT/US2014/043146, which corresponds to U.S. Appl. No. 14/596,176, 12 pages (Dean).

International Search Report and Written Opinion dated Apr. 28, 2015 received in International Patent Application No. PCT/US2015/014563, which corresponds to U.S. Appl. No. 14/179,247, 9 pages (Ellis).

International Search Report and Written Opinion dated May 8, 2015, received in International Patent Application No. PCT/US2015/017722, which corresponds to U.S. Appl. No. 14/277,716, 9 pages (Dean).

International Search Report and Written Opinion dated May 13, 2015, received in International Patent Application No. PCT/US2015/017724, which corresponds to U.S. Appl. No. 14/244,734, 12 pages, (Dean).

Office Action dated Apr. 1, 2017, received in Chinese Patent Application No. 201480024082.1 / Publication No. 102393768, which corresponds to U.S. Appl. No. 13/791,797, 12 pages (Dean).

* cited by examiner

ELECTRONIC ASSEMBLY WITH THERMAL CHANNEL AND METHOD OF MANUFACTURE THEREOF

RELATED APPLICATIONS

This Application is a continuation of PCT Patent Application Serial No. PCT/US2014/043146, filed on Jun. 19, 2014, entitled "Electronic Assembly with Thermal Channel and Method of Manufacture Thereof," which is a continuation-in-part of U.S. patent application Ser. No. 13/922,136, filed Jun. 19, 2013, entitled "Electronic Assembly with Thermal Channel and Method of Manufacture Thereof," and which claims benefit of U.S. Provisional Patent Application No. 61/946,732, filed Mar. 1, 2014, all of which are hereby incorporated by reference in their entirety.

TECHNICAL FIELD

The present invention relates generally to an electronic assembly, and more particularly to a mechanism for forming an electronic assembly with a thermal channel.

BACKGROUND ART

Modern consumer, industrial, and medical electronics, especially computing devices such as computers, laptops, servers, and combination devices, are providing increasing levels of functionality to support modern life. Research and development in the existing technologies can take a myriad of different directions.

As users become more empowered with the growth of computing devices, new and old paradigms begin to take advantage of this new device space. There are many technological solutions to take advantage of this new device functionality opportunity. One existing approach is to provide solid-state drives to be used with computing devices, such as a server, to provide high-speed access to stored data.

Solid-state drives allow users to create, transfer, store, and update computer information using electronic memory. Solid-state drives can be used to provide storage for the operating system software used to operate a computing system. Solid-state drives include multiple components that can consume power and generate heat.

However, integration of solid-state drives and computing systems for providing data storage has become a paramount concern for the user. The inability to provide systems decreases the benefit of using the tool.

Thus, a need remains for an electronic assembly with a thermal channel. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

SUMMARY

The present invention provides a method of manufacturing an electronic assembly including: providing an airflow bracket having a rail (sometimes herein called a circular rail) and an airflow tab, the airflow bracket electrically coupling the circular rail and the airflow tab; attaching a top board to the rail for electrically coupling the top board and the rail; and attaching a bottom board to the rail for electrically coupling the bottom board and the rail, the bottom board positioned to form a thermal channel between the top board and the bottom board for directing air through a vent opening of the rail.

The present invention provides an electronic assembly including: an airflow bracket having a rail and an airflow tab, the airflow bracket electrically coupling the rail and the airflow tab; a top board attached to the rail for electrically coupling the top board and the rail; and a bottom board attached to the rail for electrically coupling the top board and the rail, the bottom board positioned to form a thermal channel between the top board and the bottom board for directing air through a vent opening of the rail.

Certain embodiments of the invention have other steps or elements in addition to or in place of those mentioned above. The steps or elements will become apparent to those skilled in the art from a reading of the following detailed description when taken with reference to the accompanying drawings.

In some embodiments, an electronic assembly is formed with a thermal channel that controls an air flow for the purpose of dissipating heat generated in the electronic assembly. The electronic assembly includes a top board, a bottom board and a subassembly that couples the top and bottom boards together. The subassembly further includes a rail, an airflow tab and an interconnect. The rail has an opening through which air is directed. The airflow tab is mechanically coupled to the top board and the bottom board. The interconnect faces the airflow tab, carries electrical signals between the top board and the bottom board, and is configured to channel air directed through the opening of the rail.

BRIEF DESCRIPTION OF THE DRAWINGS

Like reference numerals refer to corresponding parts throughout the drawings.

DESCRIPTION OF EMBODIMENTS

Figure 1:
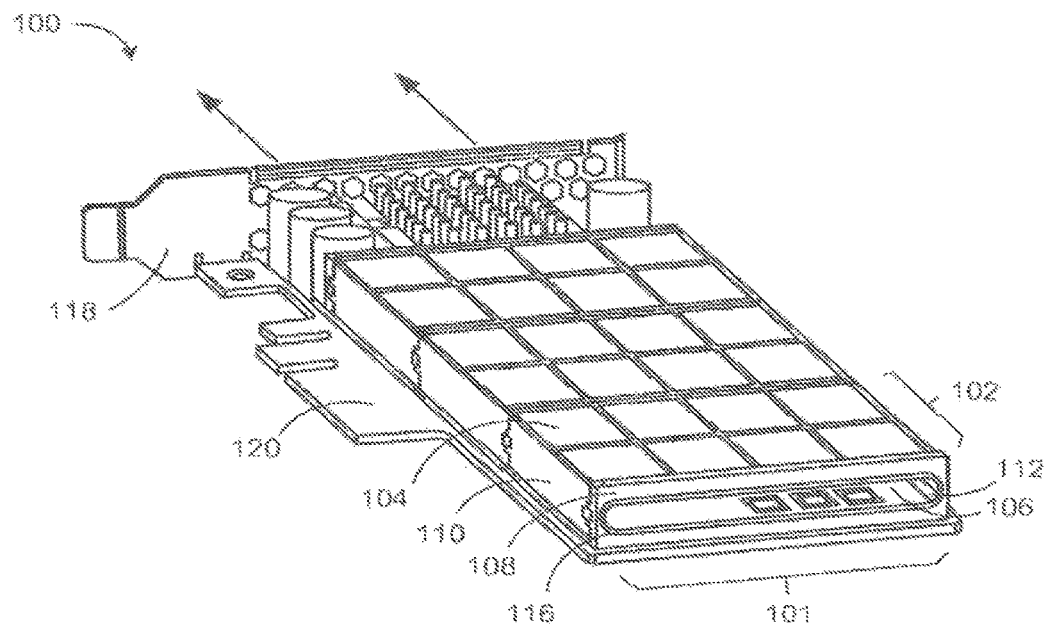
FIG. 1 is an exemplary diagram of an electronic assembly with a thermal channel in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation. The embodiments have been numbered first embodiment, second embodiment, etc. as a matter of descriptive convenience and are not intended to have any other significance or provide limitations for the present invention. Where multiple embodiments are disclosed and described having some features in common, for clarity and ease of illustration, description, and comprehension thereof, similar and like features one to another will ordinarily be described with similar reference numerals.

Referring now to FIG. 1, therein is shown an exemplary diagram of an electronic assembly 100 with a thermal channel 101 in an embodiment of the present invention. The electronic assembly 100 can include one or more of a board duct unit 102.

The electronic assembly 100 is one or more of the board duct unit 102 coupled to form the thermal channel 101 having extended length. The thermal channel 101 is an interior airflow pathway for heat dissipation. The thermal channel 101 of one of the board duct unit 102 can be aligned with the thermal channel 101 of another of the board duct unit 102 to form the thermal channel 101 having extended length.

The board duct unit 102 is an electronic device having an integrated heat dissipating channel. The board duct unit 102 can include the thermal channel 101 formed by a top board 104, a bottom board 106, and a rail 108 positioned to form a rectangular tube structure for ducting air. Rail 108 is sometimes herein called a "circular" rail to indicate that it has an opening to allow air to flow through the electronic assembly, even though the opening in rail 108 is typically not circular, and in some embodiments the opening has a rectangular shape or rectangular shape with rounded corners. The board duct unit 102 can also include airflow tabs 110 and a flexible interconnect 112 to form a portion of the thermal channel 101 to allow air to flow through the electronic assembly 100 to dissipate heat generated by the top board 104 and the bottom board 106.

The top board 104 is an electronic device. For example, the top board 104 can be a printed circuit board, a solid-state drive (SSD), a memory board, a graphics board, a controller board, a co-processor board, a communication interface, a blank board, or a combination thereof. In another example, the top board 104 can be a flash memory board of a solid-state drive.

The bottom board 106 is an electronic device. For example, the bottom board 106 can be a printed circuit board, a solid-state drive interface, a Redundant Array of Independent Disks (RAID) controller, a memory board, a graphics board, a controller board, a co-processor board, a communication interface, a blank board, or a combination thereof. In another example, the bottom board 106 can be an interface board for a flash memory system.

The flexible interconnect 112 is a flat interconnection mechanism for electrically connecting the top board 104 to the bottom board 106. The flexible interconnect 112 can be a flexible board, flexible wire array, flexible PCB, flexible flat cable, ribbon cable (e.g., a flexible flat ribbon cable), or a combination thereof. The flexible interconnect 112 can carry electrical signals between the top board 104 and the bottom board 106.

The flexible interconnect 112 can include multiple sections that together form a flat flexible structure. The flexible interconnect 112 can include overlapping sections, interlocking sections, sections that meet along a straight edge, or a combination thereof. The flexible interconnect 112 can include addition structural elements such as tape, blank sections, spacers, adhesive, fasteners, or a combination thereof.

The flexible interconnect 112 forms a substantially continuous structure extending along the length of the sides of the top board 104 and the bottom board 106. The flexible interconnect 112 can extend from the front of the top board 104 and the bottom board 106 to the back of the top board 104 and the bottom board 106. The flexible interconnect 112 is substantially as wide as the length of the top board 104 and the bottom board 106.

The flexible interconnect 112 can form one of the closed sides of the thermal channel 101. The flexible interconnect 112 can prevent air from flowing out the side of the board duct unit 102 where the flexible interconnect 112 is positioned.

The board duct unit 102 can include the rail 108 attached to the top board 104 and the bottom board 106. The rail 108 is a structural element for mounting the top board 104 and the bottom board 106. The top board 104 and the bottom board 106 are attached to the circular rail 108 and form a parallel configuration with the top board 104 positioned substantially parallel to and directly above the bottom board 106.

The board duct unit 102 can include the rail 108 at one end of the thermal channel 101 and another of the rail 108 at the opposite end of the thermal channel 101. Both ends of the thermal channel 101 can be terminated with one of the rail 108.

The board duct unit 102 can include the airflow tabs 110 attached to the rail 108. The airflow tabs 110 are flat mechanical structures extending from the rail 108 for forming an air barrier.

The airflow tabs 110 can form a portion of the sides of the thermal channel 101 in combination with the top board 104 and the bottom board 106. The airflow tabs 110 can be perpendicular to the plane of a vent opening 116 of the rail 108 (sometimes called a circular rail to indicate that it has a vent opening 116) and extend away from the circular rail 108 toward the top board 104 and the bottom board 106. The airflow tabs 110 can be perpendicular to the top board 104 and the bottom board 106. The airflow tabs 110 can be sized to have a width that substantially spans the distance between the top board 104 and the bottom board 106.

The board duct unit 102 can be formed using a variety of form factors. For example, the board duct unit 102 can be formed to fit within a Peripheral Component Interconnect (PCI) bus slot of a computer device, an ExpressCard slot, a Personal Computer Memory Card International Association (PCMIA) slot, or any other computer.

In another example, the board duct unit 102 can be configured to support an enlarged package such as multiple PCI slots, multiple ExpressCards slots, multiple PCMIA slots, or other computer interface cards slots. In yet another example, the board duct unit 102 can include host bus adapter cards, daughter cards, granddaughter cards, mezzanine cards, or a combination thereof.

In an illustrative example, the airflow can pass from the interior of a computing system, through the thermal channel 101, and exhaust out of a grill in a backplate 118. In another example, the airflow can enter from the grill of the backplate 118, flow through the thermal channel 101, and exhaust through the circular rail 108 into the interior of the computing system.

The electronic assembly 100 can be attached to an external system 120. For example, the circular rail 108 of the board duct unit 102 of the electronic assembly 100 can be attached to a PCI interface card, an ExpressCard housing, a PCMIA housing, the motherboard of a server, a bus slot of an embedded controller system, or a combination thereof.

The electronic assembly 100 can include air motion devices (not shown) to enhance the air flow through the thermal channel 101. For example, the electronic assembly 100 can include fans, piezoelectric air movers, ducts, or a combination thereof.

Although the electronic assembly 100 is described as discharging air externally, it is understood that the electronic assembly 100 can be used to receive external air and discharge the air internally. The electronic assembly 100 with the thermal channel 101 can be an air source or an air sink.

For expository purposes, the term "horizontal" as used herein is defined as a plane parallel to the top board 104, regardless of orientation. The term "vertical" is defined as a plane parallel to the vent opening 116 of the circular rail 108.

Terms, such as "above", "below", "bottom", "top", "side" (as in "sidewall"), "higher", "lower", "upper", "over", and "under", are defined with respect to the horizontal plane and with respect to the orientation facing the circular rail 108 with the airflow tabs 110 extending away from the viewer. The terms "inner" refers to the direction perpendicular to the plane of the vent opening 116 and facing away from the circular rail 108 and toward the airflow tabs 110. The term "outer" refers to the direction perpendicular to the plane of the vent opening 116 and facing away from the circular rail 108 and away from the airflow tabs 110.

It has been discovered that forming the thermal channel 101 by spacing apart the top board 104 and the bottom board 106 with the circular rail 108 increases reliability by reducing the operational temperature of the top board 104 and the bottom board 106. By providing a constricted path for uniform airflow through the thermal channel 101, the airflow can pass over the electrical components and provide heat dissipation.

It has been discovered that forming the thermal channel 101 by attaching the top board 104 and the bottom board 106 to the circular rail 108 can provide increased cooling of the electronic assembly 100 by providing a thermal path vector through the top board 104 and the bottom board 106 to the circular rail 108. By attaching the circular rail 108 to an external heat sink, the interconnection between the top board 104, the bottom board 106, and the circular rail 108 can provide an additional pathway for dissipating heat by thermal conduction through the material of the circular rail 108.

Figure 2:
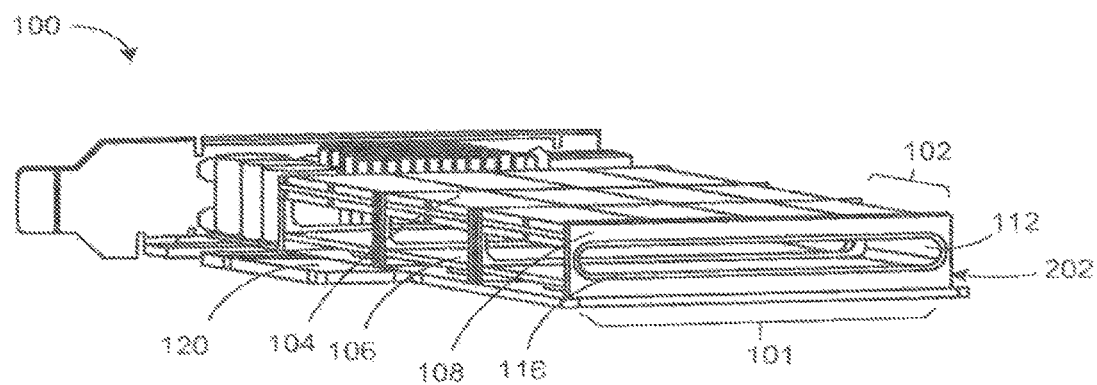
FIG. 2 is a second example of the electronic assembly.

Referring now to FIG. 2, therein is shown a second example of the electronic assembly 100. The electronic assembly 100 can include one or more of the board duct unit 102 to form the thermal channel 101.

The board duct unit 102 can include the top board 104 and the bottom board 106 attached to the circular rail 108 and the flexible interconnect 112 connected between the top board 104 and the bottom board 106. The board duct unit 102 can be shown with the airflow tabs 110 of FIG. 1 of the circular rail 108 removed.

The circular rail 108 can include the vent opening 116 to allow airflow through the circular rail 108 and through the thermal channel 101. The vent opening 116 can have a variety of configurations such as a single rounded rectangle, an oval, two rounded rectangles, two ovals, a grid, a screen, a grill with multiple vertical pillars, or a combination thereof. Although the circular rail 108 is shown having a rounded rectangle shape, it is understood that other shapes may be used.

The flow of air through the circular rail 108 and the thermal channel 101 can cause a buildup of static electricity as the air flows over the top board 104 and the bottom board 106. The circular rail 108 is an electrically conductive structure to allow the static electricity to dissipate from the top board 104 and the bottom board 106 through the circular rail 108 to an external ground. The circular rail 108 can be attached to the external system 120 to form a conductive path to ground to protect against electrostatic discharge (ESD).

The board duct unit 102 can be electrically coupled to another of the board duct unit 102 to form a conductive path for the electronic assembly 100. The circular rail 108 of one of the board duct unit 102 can be coupled to the circular rail 108 of another of the board duct unit 102 by attaching the top board 104 and the bottom board 106 between each of the circular rail 108.

The circular rail 108 can be formed using a conductive material 202. For example, the circular rail 108 can be formed from an electrostatic discharge plastic, an epoxy, a resin, a carbon-fiber composite, or a combination thereof. In another example, the circular rail 108 can include electrical conductors with the circular rail 108 or on the surface of the circular rail 108 to provide a conductive path to discharge the static electricity to an external ground.

It has been discovered that the vent opening 116 having a single rounded rectangle shape can provide increased heat flow and airflow through the thermal channel 101. The single rounded rectangle shape configuration of the vent opening 116 of the circular rail 108 can increase airflow by 15 percent over an oval shape.

It has been discovered that forming the circular rail 108 using the conductive material 202 can reduce static electricity build up by providing an electrically conductive path to ground. Forming the circular rail 108 using an electrostatic discharge plastic can prevent damage to electrical components by dissipating the electrostatic build up on the top board 104 and the bottom board 106.

It has been discovered that attaching the top board 104 and the bottom board 106 to the circular rail 108 can reduce temperatures and increase reliability. By attaching the circular rail 108 to an external heat sink, thermal conduction through the circular rail 108 to the external heat sink can allow the electronic assembly 100 to operate at a lower temperature and reduce thermally induced damage to the components of the electronic assembly 100.

Figure 3:
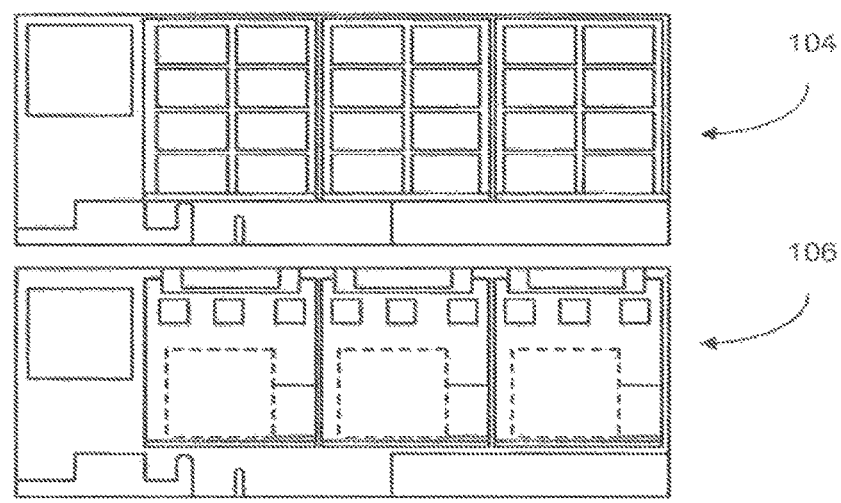
FIG. 3 is an example of the top board and the bottom board of the board duct unit.

Referring now to FIG. 3, therein is shown an example of the top board 104 and the bottom board 106 of the board duct unit 102 of FIG. 1. The board duct unit 102 can include the top board 104 and the bottom board 106. The top board 104 and the bottom board 106 can be substantially the same dimensions.

It has been discovered that configuring the top board 104 and the bottom board 106 to have similar dimensions can increase reliability of the electronic assembly 100 of FIG. 1. Forming the board duct unit 102 with the top board 104 and the bottom board 106 of similar sizes reduces the degree of air leakage within the thermal channel 101 of FIG. 1 and increases the amount of heat dissipation for the electronic assembly 100.

Figure 4:
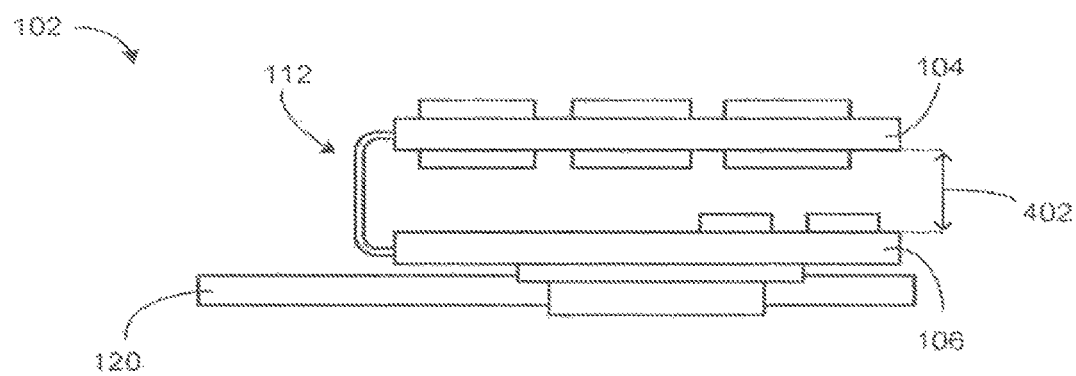
FIG. 4 is an exemplary end view of the board duct unit.

Referring now to FIG. 4, therein is shown an exemplary end view of the board duct unit 102. The board duct unit 102 can include the top board 104 connected to the bottom board 106 with the flexible interconnect 112. The circular rail 108 of FIG. 1 can be attached to the top board 104 and the bottom board 106. The circular rail 108 can be attached to the external system 120.

The top board 104 and the bottom board 106 are separated by a separation distance 402. The separation distance 402 is the distance between the top board 104 and the bottom board 106. The separation distance 402 can be determined by the configuration of the circular rail 108 and the flexible interconnect 112.

For example, the separation distance 402 can be sized to fit within a PCI card slot. In another example, the separation distance 402 can be sized to fit within two PCI card slots for additional heat dissipation.

It has been discovered the configuring the separation distance 402 of the top board 104 and the bottom board 106 increases reliability by providing additional heat dissipation. Configuring the circular rail 108 and the flexible interconnect 112 to maximize the separation distance 402 provides additional air flow for improved heat dissipation.

Figure 5:
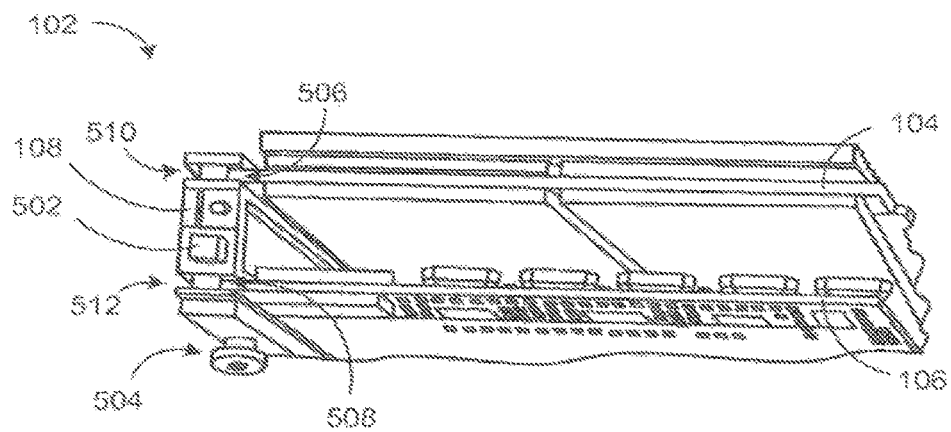
FIG. 5 is an exemplary side view of the board duct unit.

Referring now to FIG. 5, therein is shown an exemplary side view of the board duct unit 102. The top board 104 and the bottom board 106 can be attached to the circular rail 108. The airflow tabs 110 of FIG. 1 are not shown in FIG. 5 for clarity.

The circular rail 108 can include locking tabs 502. The locking tabs 502 are structures for securing the circular rail 108 to another component. For example, the locking tabs 502 can be rectangular structures on the left and right sides of the circular rail 108 that extend outward from the circular rail 108 for attaching to the airflow tabs 110 attached to another of the circular rail 108. In another example, the locking tabs 502 can be on the top side of the circular rail 108.

The locking tabs 502 can be formed in a variety of ways. The locking tabs 502 can be formed as part of the circular rail 108, as separate elements attached to the circular rail 108, or a combination thereof.

Although the locking tabs 502 are shown as having a rectangular shape, it is understood that the locking tabs 502 can be configured in a variety of ways. For example, the locking tabs 502 can be rectangular, round, oval, triangular, or a combination thereof.

The circular rail 108 can include mounting fasteners 504. The mounting fasteners 504 are mechanical elements for attaching the circular rail 108 to the external system. For example, the mounting fasteners 504 can attach the circular rail 108 to the motherboard, a printed circuit board, an interface card, a mounting frame, a cover, or a combination thereof. The mounting fasteners 504 can include screws, detent pins, pushpins, heat staked boss and holes, or a combination thereof.

The circular rail 108 can include an inner top groove 506 and an inner bottom groove 508 for attaching to circuit boards, such as the top board 104, the bottom board 106, or a combination thereof. The inner top groove 506 and the inner bottom groove 508 are sized to receive the top board 104 and the bottom board 106 in an interference fit. The inner top groove 506 and the inner bottom groove 508 have the same vertical width as the thickness of the printed circuit boards of the top board 104 and the bottom board 106.

The circular rail 108 can include an outer top groove 510 and an outer bottom groove 512 for attaching to external circuit boards. The outer top groove 510 and the outer bottom groove 512 are sized to receive external circuit boards in an interference fit. The outer top groove 510 and the outer bottom groove 512 have the same vertical width as the thickness of the external printed circuit boards.

In an illustrative example, the electronic assembly 100 of FIG. 1 having extended length can be formed by inserting the top board 104 into the inner top groove 506 of the circular rail 108 and inserting another of the top board 104 into the outer top groove 510 of another of the circular rail 108. Similarly, the bottom board 106 can be inserted into the inner bottom groove 508 of the circular rail 108 and another of the bottom board 106 can be inserted into the outer bottom groove 512 of the circular rail 108.

The circular rail 108 can hold the printed circuit boards, such as the top board 104 and the bottom board 106, in a rigid configuration. For example, the top board 104 can be inserted into the inner top groove 506 and held in place with an interference fit. The bottom board 106 can be inserted in to the inner bottom groove 508 and held in place with an interference fit.

In another example, the top board 104 can be secured in the inner top groove 506 with an adhesive (not shown). The bottom board 106 can be secured in the inner bottom groove 508 with the adhesive.

Figure 6:
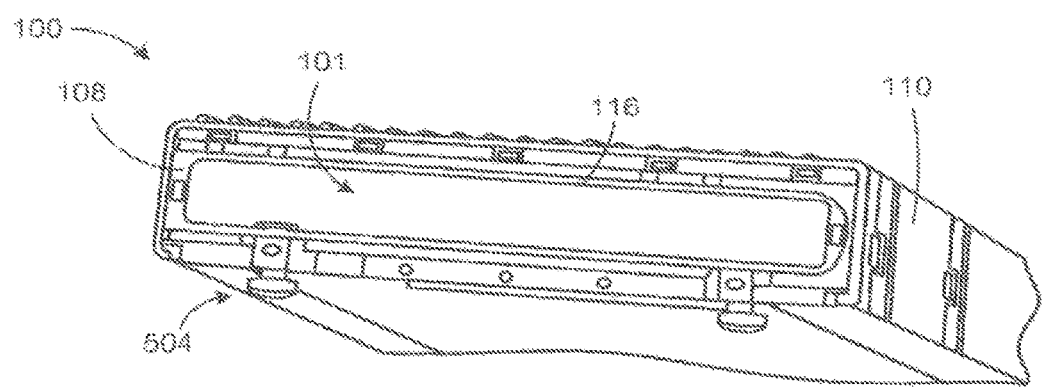
FIG. 6 is an exemplary front view of the electronic assembly.

Referring now to FIG. 6, therein is shown an exemplary front view of the electronic assembly 100. The electronic assembly 100 can include the board duct unit 102 of FIG. 1 with the circular rail 108, the vent opening 116, the airflow tabs 110, and the mounting fasteners 504.

The board duct unit 102 can include the airflow tabs 110 attached to the circular rail 108. The airflow tabs 110 form the sides of the thermal channel 101.

The circular rail 108 can include the vent opening 116 providing access to ambient air outside of the thermal channel 101. The vent opening 116 can have a rounded rectangle shape.

The circular rail 108 can include the mounting fasteners 504 for attaching the electronic assembly 100 to the external system 120 of FIG. 1. The mounting fasteners 504 can include screws, detent pins, pushpins, heat staked boss and holes, or a combination thereof.

Figure 7:
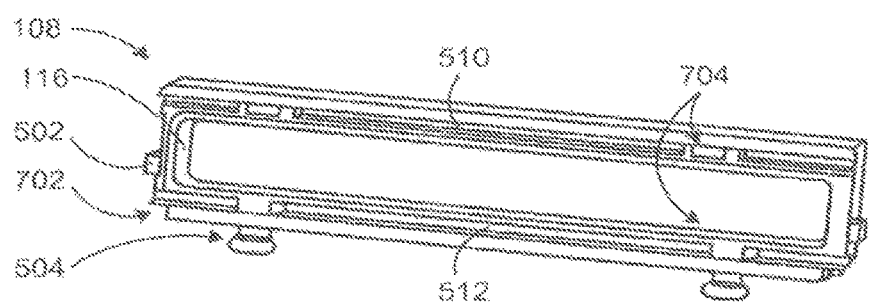
FIG. 7 is an exemplary front view of a circular rail.

Referring now to FIG. 7, therein is shown an exemplary front view of the circular rail 108. The circular rail 108 can include the vent opening 116, the outer top groove 510, the outer bottom groove 512, the locking tabs 502, and the mounting fasteners 504.

The circular rail 108 can include the vent opening 116. Although the vent opening 116 is shown in the shape of a rounded rectangle, it is understood that the vent opening 116 can have other shapes. For example, the vent opening 116 can have shapes including an oval, a rectangle, a grid of geometric shapes, slits, or a combination thereof.

The vent opening 116 can have different configurations. The vent opening 116 is shown as a single opening, but it is understood that the vent opening 116 can include any number of openings. For example, the vent opening 116 can include configurations with two or more openings, a grid, an array of slots, or a combination thereof.

The vent opening 116 can include a variety of surface finishes. For example, the vent opening 116 can have a polished finish to reduce air flow turbulence through the vent opening 116. In another example, the vent opening 116 can have a matte finish to reduce drag and alter the laminar air flow through the vent opening 116.

It has been discovered that forming the vent opening 116 in the circular rail 108 having a polished finish can increase heat dissipation by up to 15 percent by increasing the air flow through the vent opening 116. The polished finish can allow smoother air flow with less turbulence to increase the overall volume of air passing through the vent opening 116 per unit time.

The circular rail 108 can include the outer top groove 510 and the outer bottom groove 512 on an outer side 702 of the circular rail 108. The outer side is the side of the circular rail 108 facing away from where the top board 104 of FIG. 1 and the bottom board 106 of FIG. 1 can be attached. The outer side 702 is the side of the circular rail 108 facing away from the airflow tabs 110 of FIG. 1.

The outer top groove 510 can be used to attach the circular rail 108 to an external circuit board, such as another one of the top board 104. The outer bottom groove 512 can be used to attach the circular rail 108 to an external circuit board, such as another one of the bottom board 106.

The outer top groove 510 and the outer bottom groove 512 can connect the circular rail 108 to another set of the top board 104 and the bottom board 106 to form the thermal channel having extended length. The outer top groove 510 and the outer bottom groove 512 allow multiple units to be cascaded together to form the thermal channel of varying length.

The circular rail 108 can include the locking tabs 502 on the left and right sides of the circular rail 108. The locking tabs 502 can extend laterally outward from the circular rail 108.

The circular rail 108 can include the mounting fasteners 504 at the bottom side of the circular rail 108. The mounting fasteners 504 are mechanisms for attaching the circular rail 108 to an external system. For example, the mounting fasteners 504 can be screws fitting into screw holes at the bottom of the circular rail 108 attaching the circular rail 108 to the external system 120 of FIG. 1.

The circular rail 108 can include a board lock 704 to limit which printed circuit boards can be inserted into the outer top groove 510, the outer bottom groove 512, the inner top groove 506 of FIG. 5, or the inner bottom groove 508 of FIG. 5. The board lock 704 is a mechanical structure for connecting two related elements. For example, the board lock 704 can include a matching tab and slot configuration.

The board lock 704 can be configured to allow only a printed circuit board having a matching configuration to be inserted into a matching receptacle such as the outer top groove 510, the outer bottom groove 512, the inner top groove 506, inner bottom groove, a combination thereof. For example, the board lock 704 can be configured such that only the front end of the top board 104 can be inserted into the inner top groove 506. In another example, the board lock 704 can be configured such that only the front end of the bottom board 106 can be inserted into the inner bottom groove 508.

The board lock 704 can be implemented in a variety of ways. For example, the board lock 704 can include a set of slots in the outer top groove 510 for accepting a matching tab on a portion of a particular printed circuit board, such as the back end of the top board 104. In another example, the board lock 704 can include a set of tabs in the outer bottom groove 512 for inserting to a matching slot in a portion of a particular type of printed circuit board, such as the back end of the bottom board 106. The board lock 704 can include structural elements such as slots, tabs, bars, openings, or a combination thereof.

It has been discovered that the circular rail 108 having the board lock 704 can increase reliability and reduce manufacturing errors. Configuring each of the outer top groove 510, the outer bottom groove 512, the inner top groove 506, and the inner bottom groove 508 to have a separate type of the board lock 704 can insure that the proper board is inserted into the matching groove.

Figure 8:
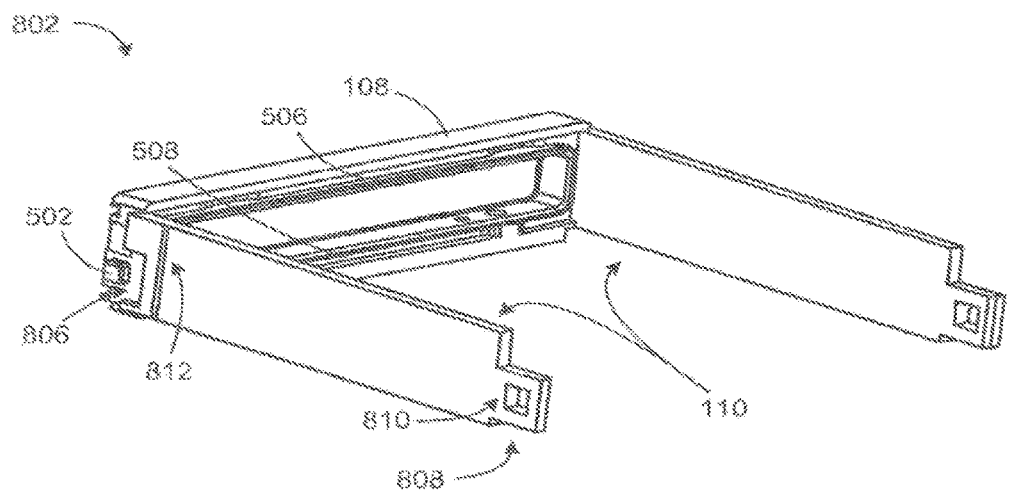
FIG. 8 is a first exemplary isometric view of an airflow bracket.

Referring now to FIG. 8, therein is shown a first exemplary isometric view of an airflow bracket 802. The airflow bracket 802 can include the circular rail 108 and the airflow tabs 110. The airflow bracket 802 has a vent opening 116 (shown in FIG. 9) through which air can flow.

The airflow bracket 802 can include the circular rail 108 with one of the airflow tabs 110 attached on the left side of the circular rail 108. The airflow bracket 802 can include another of the airflow tabs 110 attached on the right side of the circular rail 108.

The airflow tabs 110 can be attached to the circular rail 108 in a position to prevent the motion of the top board 104 of FIG. 1 in the inner top groove 506. The airflow tabs 110 can be attached to the circular rail 108 in a position to prevent the lateral motion of the bottom board 106 of FIG. 1 in the inner bottom groove 508.

The airflow tabs 110 can be formed from a variety of electrically conductive materials. For example, the airflow tabs 110 can be formed from the same material as the circular rail 108. In another example, the airflow tabs 110 can be formed from a metal, metal alloy, electric static discharge plastic, a conductive plastic, a conductive composite material, or a combination thereof. In yet another example, the airflow tabs 110 can include discrete conductive elements such as wires, traces, contacts, or a combination thereof.

The airflow bracket 802 can be formed in a variety of ways. For example, the airflow bracket 802 can be formed by injection molding, three-dimensional printing (3D printing), casting, machining with a Computer Numerical Controlled (CNC) machine, pressing, cutting, or a combination thereof.

The airflow bracket 802 can be formed as a single unit or assembled from individual components. For example, the airflow bracket 802 can be formed as a single unit including the circular rail 108 and the airflow tabs 110.

In another example, the airflow bracket 802 can be formed by attaching the airflow tabs 110 to the circular rail 108. The airflow tabs 110 can be attached to the circular rail 108 with an adhesive, fasteners, welding, or a combination thereof.

The airflow bracket 802 can form an electrically conductive structure to allow the discharge of static electricity. As air flows through structures in the thermal channel 101 of FIG. 1, a static electric charge can accumulate. The circular rail 108 and the airflow tabs 110 are electrically connected and provide a conductive path to discharge the static charge to ground.

The airflow bracket 802 can discharge static electricity to ground in a variety of ways. For example, the airflow bracket 802 can be grounded using the mounting fasteners 504 of FIG. 5 that are connected to the external system 120 of FIG. 1 or next higher assembly. In another example, the airflow bracket 802 can be electrically connected to the top board 104 and the bottom board 106 for the discharge of static electricity.

The circular rail 108 can include the mounting fasteners 504 attached to the bottom portion of the circular rail 108. The mounting fasteners 504 can be electrically coupled to the external system and to the circular rail 108 in a variety of ways. For example, the mounting fasteners 504 can include metal screws that are electrically connected to screw holes in the circular rail 108. In another example, the mounting fasteners 504 can include conductive rivets that are attached to the circular rail 108 and the external system.

The mounting fasteners 504 can provide a thermally conductive path from the airflow bracket 802 to the external system. The airflow bracket 802 can allow the flow of heat from the top board 104 and the bottom board 106 into the circular rail 108 and from the circular rail 108 to the external system via the mounting fasteners 504.

The airflow tabs 110 can include a tab notch 806 and a tab extension 808. The tab notch 806 is an opening at the end of one of the airflow tabs 110 where one of the airflow tabs 110 is attached to the circular rail 108. The tab extension 808 is a protrusion at the opposite end of one of the airflow tabs 110 from the tab notch 806.

The tab extension 808 extends outward on the side opposite from the tab notch 806. The tab extension 808 extends away from the circular rail 108. The tab extension 808 can be formed by removing portions of the end of the airflow tabs 110 to form a shape complementary to the tab notch 806.

The tab extension 808 is sized to fit within the tab notch 806 of another one of the airflow bracket 802. The tab notch 806 can have a depth that is one half of the length of the tab extension 808.

The tab notch 806 can have a complementary shape to the shape of the tab extension 808. The tab extension 808 can be inserted into the tab notch 806 of another of the airflow tabs 110. When the tab extension 808 is inserted into the tab notch 806, the surface of both of the airflow tabs 110 can be coplanar.

The tab notch 806 and the tab extension 808 can have a variety of complementary shapes. Although the tab notch 806 and the tab extension 808 are shown as having rectangular shapes, it is understood that the tab notch 806 and the tab extension 808 can have other complementary shapes including ovals, circles, triangles, arrows, or a combination thereof.

The tab extension 808 can include locking tab holes 810. The locking tab holes 810 is an opening in the tab extension 808 of one of the airflow tabs 110 for receiving one of the locking tabs 502. The locking tab holes 810 can mirror the shape of one of the locking tabs 502 of the circular rail 108.

The locking tab holes 810 can have a shape and dimensions similar to the locking tabs 502 of the circular rail 108. The locking tab holes 810 can attach to the locking tabs 502 in an interference fit. The locking tabs 502 of the circular rail 108 can be inserted into the locking tab holes 810 in the tab extension 808 to attach one of the airflow bracket 802 to another of the airflow bracket 802.

Although the locking tabs 502 and the locking tab holes 810 are shown as square in shape, it is understood that the locking tabs 502 and the locking tab holes 810 can have a variety of shapes. For example, the locking tabs 502 and the locking tab holes 810 can be rectangular, triangular, circular, oval, or a combination thereof.

In an illustrative example, two of the airflow bracket 802 can be attached to one another to form the thermal channel 101 having an extended length by coupling the locking tab holes 810 of one of the airflow bracket 802 to the locking tabs 502 of the circular rail 108 of another of the airflow bracket 802. The airflow tabs 110 can form an extended structure to constrain the airflow though the thermal channel 101.

The airflow tabs 110 can include a scoring groove 812. The scoring groove 812 is an depression running from the outer top side of one of the airflow tabs 110 to the outer bottom side. The scoring groove 812 is positioned on the end of the airflow tabs 110 closest to the circular rail 108. The scoring groove 812 can allow a portion of the airflow tabs 110 to be snapped off at the scoring groove 812 and removed.

In an illustrative example, removing the portion of the airflow tabs 110 by separating one of the airflow tabs 110 at the scoring groove 812 can allow the thermal channel 101 to be formed with one side formed by the flexible interconnect 112 of FIG. 1 and another side formed by one of the airflow tabs 110. In another illustrative example, removing both of the airflow tabs 110 by separating the airflow tabs 110 at the scoring groove 812 can allow the circular rail 108 to be attached to the back end of a series of the airflow bracket 802 forming the thermal channel 101 having an extended length.

The circular rail 108 includes the inner top groove 506. The inner top groove 506 is a horizontal opening along the top portion of the circular rail 108. The inner top groove 506 is for receiving the top board 104. The inner top groove 506 can hold the top board 104 in an interference fit.

The circular rail 108 includes the inner bottom groove 508. The inner bottom groove 508 is a horizontal opening along the bottom portion of the circular rail 108. The inner bottom groove 508 is for receiving the bottom board 106. The inner bottom groove 508 can hold the bottom board 106 in an interference fit.

It has been discovered that forming the airflow tabs 110 with the scoring groove 812 provides increased flexibility. The scoring groove 812 allows the removal of one of the airflow tabs 110 from the airflow bracket 802 and the use of the flexible connector to provide one side of the thermal channel 101. The scoring groove 812 provides the airflow tabs 110 with ad hoc manufacturing flexibility by being removable to accommodate multiple manufacturing configurations.

It has been discovered that forming the airflow bracket 802 having the circular rail 108 with the locking tabs 502 and the airflow tabs 110 with the locking tab holes 810 increases functionality and reliability. By allows the locking tabs 502 to be attached to the locking tab holes 810, another of the circular rails can be attached to the airflow tabs 110 to form the thermal channel 101 with an extended length.

It has been discovered that forming the airflow bracket 802 with the airflow tabs 110 having the tab notch 806 and the tab extension 808 provides increased functionality, reduced error rates, and improved thermal conductivity. Connecting the tab extension 808 into the tab notch 806 of another of the airflow tabs 110 forms a mechanical interlock to hold the airflow tabs 110 in place and prevents vertical motion of the airflow tabs 110.

It has been discovered that attaching the airflow tabs 110 to the circular rail 108 increases reliability by preventing horizontal motion of the top board 104 and the bottom board 106. Positioning the airflow tabs 110 at the sides of the circular rail 108 forms a mechanical stop to reduce the motion of the printed circuit boards. Reducing the motion of the printed circuit boards prevents mechanical separation of the top board 104 and the bottom board 106 from the circular rail 108.

It has been discovered that forming the airflow bracket 802 having the airflow tabs 110 that are removable provides increased functionality and reliability by allowing both of the airflow tabs 110 to be removed from the circular rail 108 to allow the circular rail 108 to be used to cap the end of the thermal channel 101 having extended length. The circular rail 108 can support the top board 104 and the bottom board 106 at the end of the thermal channel 101.

It has been discovered that the airflow bracket 802 provides increased reliability and electrostatic discharge protection by forming a conductive path with the circular rail 108, the airflow tabs 110, and the mounting fasteners 504. Because the airflow bracket 802 is electrically conductive and connected to ground via the mounting fasteners 504, the airflow bracket 802 can safely discharge accumulating static electric charge to prevent damage to electrical components on the top board 104 and the bottom board 106.

It has been discovered that the airflow bracket 802 provides increased reliability and heat dissipation by forming the thermal channel 101 with the top board 104, the bottom board 106, the airflow tabs 110, and the flexible interconnect 112. By forming a constrained path for the flow of air over the surfaces of the top board 104 and the bottom board 106, the airflow bracket 802 increases the amount of thermal energy discharged through the thermal channel 101 as the heated air flows out of the system.

Figure 9:
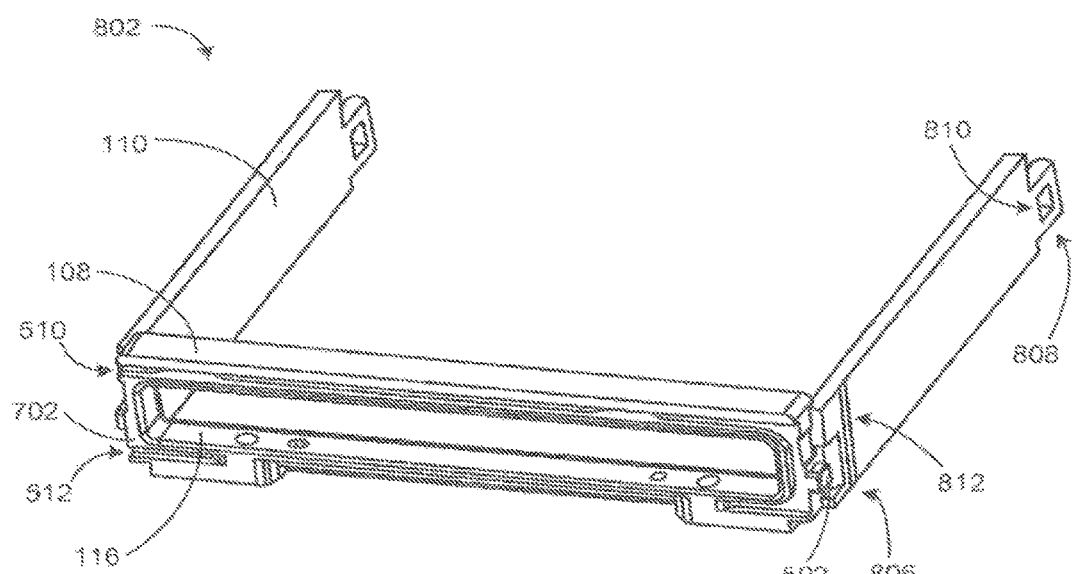
FIG. 9 is a second exemplary isometric view of the airflow bracket.

Referring now to FIG. 9, therein is shown a second exemplary isometric view of the airflow bracket 802. The airflow bracket 802 can include the circular rail 108 and the airflow tabs 110.

The airflow tabs 110 can form the sides of the thermal channel 101 in combination with the top board 104 of FIG. 1 and the bottom board 106 of FIG. 1. The airflow tabs 110 are perpendicular to the plan of the vent opening 116 of the circular rail 108.

The airflow bracket 802 can include the circular rail 108 with one of the airflow tabs 110 attached on the left side of the circular rail 108. The airflow bracket 802 can include another of the airflow tabs 110 attached on the right side of the circular rail 108.

The airflow tabs 110 can be formed from a variety of electrically conductive materials. For example, the airflow tabs 110 can be formed from the same material as the circular rail 108. In another example, the airflow tabs 110 can be formed from a metal, metal alloy, electric static discharge plastic, a conductive plastic, a conductive composite material, or a combination thereof. In yet another example, the airflow tabs 110 can include discrete conductive elements such as wires, traces, contacts, or a combination thereof.

The airflow bracket 802 can form an electrically conductive structure to allow the discharge of static electricity. As air flows through structures in the thermal channel 101 of FIG. 1, a static electric charge can accumulate. The circular rail 108 and the airflow tabs 110 are electrically connected and provide a conductive path to discharge the static charge to ground.

The airflow bracket 802 can discharge static electricity to ground in a variety of ways. For example, the airflow bracket 802 can be grounded using the mounting fasteners 504 of FIG. 5 that are connected to an external system or next higher assembly. In another example, the airflow bracket 802 can be electrically connected to the top board 104 and the bottom board 106 for the discharge of static electricity.

The circular rail 108 can include the mounting fasteners 504 attached to the bottom portion of the circular rail 108. The mounting fasteners 504 can be electrically coupled to the external system and to the circular rail 108 in a variety of ways. For example, the mounting fasteners 504 can include metal screws that are electrically connected to screw holes in the circular rail 108. In another example, the mounting fasteners 504 can include conductive rivets that are attached to the circular rail 108 and the external system.

The mounting fasteners 504 can provide a thermally conductive path from the airflow bracket 802 to the external system. The airflow bracket 802 can allow the flow of heat from the top board 104 and the bottom board 106 into the circular rail 108 and from the circular rail 108 to the external system via the mounting fasteners 504.

The airflow tabs 110 can include the tab notch 806 and the tab extension 808. The tab notch 806 is an opening at the end of one of the airflow tabs 110 where one of the airflow tabs 110 is attached to the circular rail 108. The tab extension 808 is a protrusion at the opposite end of one of the airflow tabs 110 from the tab notch 806.

The tab extension 808 extends outward on the side opposite from the tab notch 806. The tab extension 808 extends away from the circular rail 108. The tab extension 808 can be formed by removing portions of the end of the airflow tabs 110 to form a shape complementary to the tab notch 806.

The tab extension 808 is sized to fit within the tab notch 806 of another one of the airflow bracket 802. The tab notch 806 can have a depth that is one half of the length of the tab extension 808.

The tab notch 806 can have a complementary shape to the shape of the tab extension 808. The tab extension 808 can be inserted into the tab notch 806 of another of the airflow tabs 110. When the tab extension 808 is inserted into the tab notch 806, the surface of both of the airflow tabs 110 can be coplanar.

The tab notch 806 and the tab extension 808 can have a variety of complementary shapes. Although the tab notch 806 and the tab extension 808 are shown as having rectangular shapes, it is understood that the tab notch 806 and the tab extension 808 can have other complementary shapes including ovals, circles, triangles, arrows, or any other shape.

The tab extension 808 can include the locking tab holes 810. The locking tab holes 810 is an opening through the tab extension 808 of one of the airflow tabs 110. The locking tab holes 810 can mirror the shape of one of the locking tabs 502 of the circular rail 108.

The locking tab holes 810 can have a shape and dimensions similar to the locking tabs 502 of the circular rail 108. The locking tab holes 810 can attach to the locking tabs 502 in an interference fit. The locking tabs 502 of the circular rail 108 can be inserted into the locking tab holes 810 in the tab extension 808 to attach one of the airflow bracket 802 to another of the airflow bracket 802.

Although the locking tabs 502 and the locking tab holes 810 are shown as square in shape, it is understood that the locking tabs 502 and the locking tab holes 810 can have a variety of shapes. For example, the locking tabs 502 and the locking tab holes 810 can be rectangular, triangular, circular, oval, or a combination thereof.

In an illustrative example, two of the airflow bracket 802 can be attached to one another to form the thermal channel 101 having an extended length by coupling the locking tab holes 810 of one of the airflow bracket 802 to the locking tabs 502 of the circular rail 108 of another of the airflow bracket 802. The airflow tabs 110 can form an extended structure to constrain the airflow though the thermal channel 101.

The airflow tabs 110 can include the scoring groove 812. The scoring groove 812 is positioned on the end of the airflow tabs 110 closest to the circular rail 108. The scoring groove 812 can allow a portion of the airflow tabs 110 to be snapped off at the scoring groove 812 and removed.

In an illustrative example, removing the portion of the airflow tabs 110 by separating one of the airflow tabs 110 at the scoring groove 812 can allow the thermal channel 101 to be formed with one side formed by the flexible interconnect 112 of FIG. 1 and another side formed by one of the airflow tabs 110. In another illustrative example, removing both of the airflow tabs 110 by separating the airflow tabs 110 at the scoring groove 812 can allow the circular rail 108 to be attached to the back end of a series of the airflow bracket 802 forming the thermal channel 101 having an extended length.

The circular rail 108 can include the outer top groove 510 and the outer bottom groove 512 on the outer side 702 of the circular rail 108. The outer side is the side of the circular rail 108 facing away from where the top board 104 and the bottom board 106 can be attached. The outer side 702 is the side of the circular rail 108 facing away from the airflow tabs 110.

The outer top groove 510 can be used to attach the airflow bracket 802 to an external circuit board, such as another one of the top board 104. The outer bottom groove 512 can be used to attach the airflow bracket 802 to an external circuit board, such as another one of the bottom board 106.

The outer top groove 510 and the outer bottom groove 512 can connect the circular rail 108 to another set of the top board 104 and the bottom board 106 to form the thermal channel having extended length. The outer top groove 510 and the outer bottom groove 512 allow multiple units to be cascaded together to form the thermal channel of varying length.

It has been discovered that forming the airflow tabs 110 with the scoring groove 812 provides increased flexibility. The scoring groove 812 allows the removal of one of the airflow tabs 110 from the airflow bracket 802 and the use of the flexible interconnect 112 to provide one side of the thermal channel 101. The scoring groove 812 provides the airflow tabs 110 with ad hoc manufacturing flexibility by being removable to accommodate multiple manufacturing configurations.

It has been discovered that forming the airflow bracket 802 having the circular rail 108 with the locking tabs 502 and the airflow tabs 110 with the locking tab holes 810 increases functionality and reliability. By allows the locking tabs 502 to be attached to the locking tab holes 810, another of the circular rails can be attached to the airflow tabs 110 to form the thermal channel 101 with an extended length.

It has been discovered that forming the airflow bracket 802 with the airflow tabs 110 having the tab notch 806 and the tab extension 808 provides increased functionality, reduced error rates, and improved thermal conductivity. Connecting the tab extension 808 into the tab notch 806 of another of the airflow tabs 110 forms a mechanical interlock to hold the airflow tabs 110 in place and prevents vertical motion of the airflow tabs 110.

It has been discovered that attaching the airflow tabs 110 to the circular rail 108 increases reliability by preventing horizontal motion of the top board 104 and the bottom board 106. Positioning the airflow tabs 110 at the sides of the circular rail 108 forms a mechanical stop to reduce the motion of the printed circuit boards. Reducing the motion of the printed circuit boards prevents mechanical separation of the top board 104 and the bottom board 106 from the circular rail 108.

It has been discovered that forming the airflow bracket 802 having the airflow tabs 110 that are removable provides increased functionality and reliability by allowing both of the airflow tabs 110 to be removed from the circular rail 108 to allow the circular rail 108 to be used to cap the end of the thermal channel 101 having extended length. The circular rail 108 can support the top board 104 and the bottom board 106 at the end of the thermal channel 101.

It has been discovered that the airflow bracket 802 provides increased reliability and electrostatic discharge protection by forming a conductive path with the circular rail 108, the airflow tabs 110, and the mounting fasteners 504. Because the airflow bracket 802 is electrically conductive and connected to ground via the mounting fasteners 504, the airflow bracket 802 can safely discharge accumulating static electric charge to prevent damage to electrical components on the top board 104 and the bottom board 106.

It has been discovered that the airflow bracket 802 provides increased reliability and heat dissipation by forming the thermal channel 101 with the top board 104, the bottom board 106, the airflow tabs 110, and the flexible interconnect 112. By forming a constrained path for the flow of air over the surfaces of the top board 104 and the bottom board 106, the airflow bracket 802 increases the amount of thermal energy discharged through the thermal channel 101 as the heated air flows out of the system.

Figure 10:
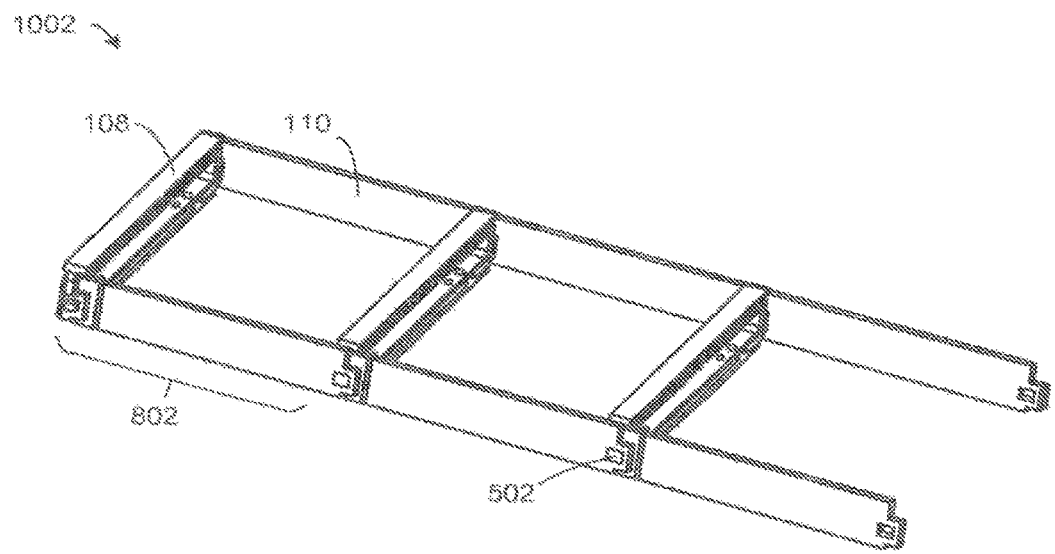
FIG. 10 is a first exemplary isometric view of a circular rail assembly.

Referring now to FIG. 10, therein is shown a first exemplary isometric view of a circular rail assembly 1002. The circular rail assembly 1002 can include one of the airflow bracket 802 attached to another of the airflow bracket 802.

The circular rail assembly 1002 can include the circular rail 108 having the airflow tabs 110 attached to the locking tabs 502 of another of the circular rail 108. The circular rail assembly 1002 can illustrate the formation of the thermal channel having extended length.

For example, the circular rail assembly 1002 can include three of the circular rail 108 having the airflow tabs 110. The airflow tabs 110 of one of the circular rail 108 can be attached to the locking tabs 502 of the next one of the circular rail 108 to form a portion of the electronic assembly 100 of FIG. 1 having extended length.

Figure 11:
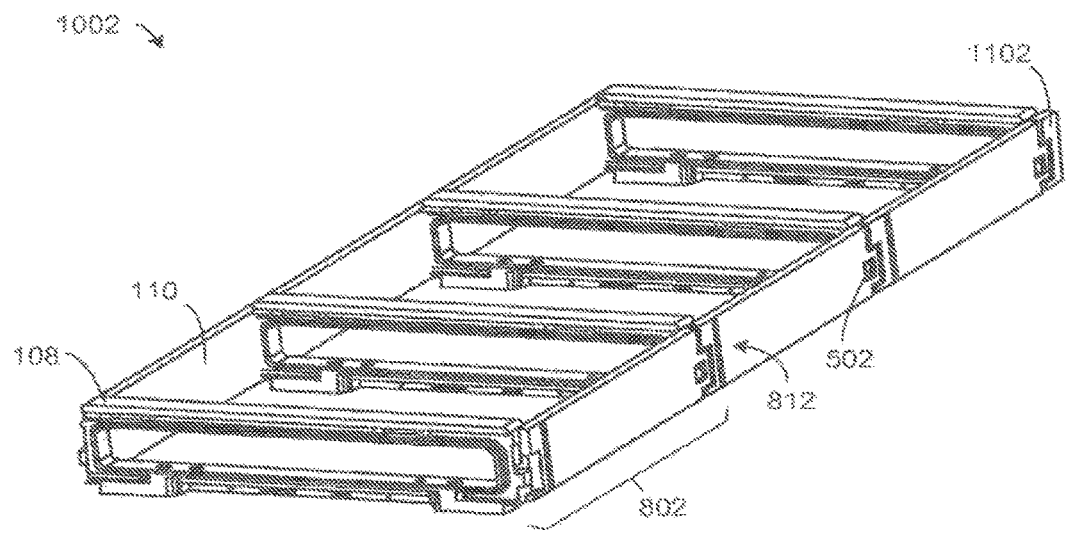
FIG. 11 is a second exemplary isometric view of a circular rail assembly.

Referring now to FIG. 11, therein is shown a second exemplary isometric view of the circular rail assembly 1002.

The circular rail assembly 1002 can include one of the airflow bracket 802 attached to another of the airflow bracket 802.

The circular rail assembly 1002 can include the circular rail 108 having the airflow tabs 110 attached to the locking tabs 502 of another of the circular rail 108. The last of the circular rail 108 in the circular rail assembly 1002 can include a tab stub 1102 formed by separating one of the airflow tabs 110 at the scoring groove 812. The circular rail assembly 1002 can illustrate the formation of the thermal channel having extended length.

It has been discovered that separating the airflow tabs 110 at the scoring groove 812 can increase functionality and increase reliability by allowing the circular rail 108 to be attached to the end of the circular rail assembly 1002. By removing the airflow tabs 110, the circular rail 108 can be attached to the top board of FIG. 1 and the bottom board 106 of FIG. 1 to hold the circular rail assembly 1002 together without adding the additional length of the airflow tabs 110.

Figure 12:
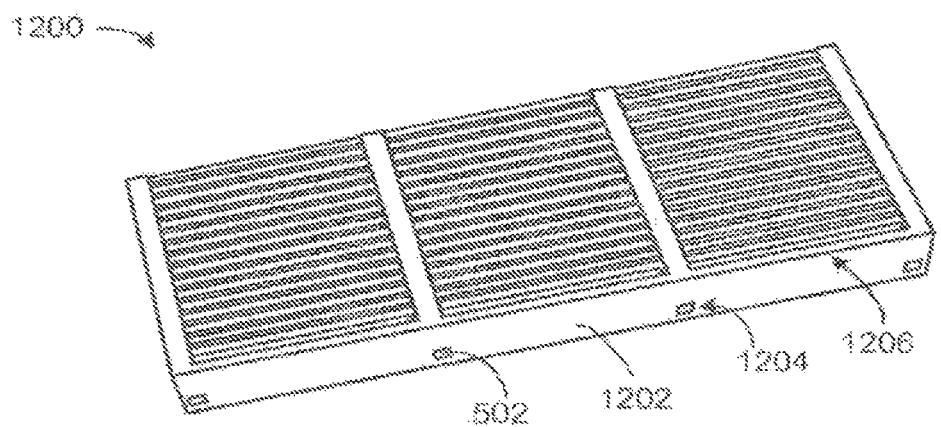
FIG. 12 is an exemplary isometric top view of the electronic assembly in a second embodiment of the present invention.

Referring now to FIG. 12, therein is shown an exemplary isometric top view of the electronic assembly 1200 in a second embodiment of the present invention. The electronic assembly 100 can include an external cover 1202 around the circular rail 108 and the top board 104 and the bottom board 106 of FIG. 1.

The electronic assembly 1200 is formed in the manner of the electronic assembly 100 of FIG. 1. The electronic assembly 1200 has similar named elements as in the electronic assembly 100.

The external cover 1202 is a mechanical structure forming an enclosure to create the thermal channel 101 of FIG. 1. The external cover 1202 can provide a top, bottom, and side barrier to air flow to direct the flow of air through the thermal channel 101.

The external cover 1202 can be used to form the side walls of the thermal channel 101. The external cover 1202 can replace the airflow tabs 110 of FIG. 1 to form the side walls of the thermal channel 101. The external cover 1202 can be directly attached to the circular rail 108.

The external cover 1202 can be configured in a variety of ways. For example, the external cover 1202 can be configured to cover the circular rail 108 of FIG. 1 and provide a solid top, bottom, and side wall. In another example, the external cover 1202 can cover a portion of the top of the circular rail 108 and form a continuous side wall. The external cover 1202 can include openings in the top and bottom sides to allow exposed the top board 104 and the bottom board, respectively.

The external cover 1202 can be attached to the circular rail 108 in a variety of ways. For example, the external cover 1202 can include cover holes 1204 for attaching to the locking tabs 502 of the circular rail 108. In another example, the external cover 1202 can be attached to the locking tabs 502 on the top of the circular rail 108.

The external cover 1202 can be sized to form the electronic assembly 100 having extended length. For example, the external cover 1202 can be sized to cover three sets of the top board and the bottom board 106. The external cover 1202 can be configured to cover any number of sets of the top board 104 and the bottom board 106.

The electronic assembly 100 can include a heat sink 1206 attached to the top board 104. The heat sink 1206 is a thermally conductive structure to increase the amount of heat dissipation. For example, the heat sink 1206 can be attached to the top board 104 and be exposed from the external cover 1202. In another example, the heat sink 1206 can be attached to the top board 104 and be exposed within the thermal channel 101 to dissipate heat in the air flow through the thermal channel 101. Similarly, the heat sink 1206 can be attached to the bottom board 106 within and external to the thermal channel 101. The heat sink 1206 can be attached to the external cover 1202 or directly to the circular rail 108 to increase heat dissipation.

It has been discovered that covering the airflow bracket 802 of FIG. 8 with the external cover 1202 can increase heat dissipation. By forming a continuous cover around the top board 104 and the bottom board 106, the external cover 1202 can direct air through the thermal channel and minimize lateral air leaks.

Figure 13:
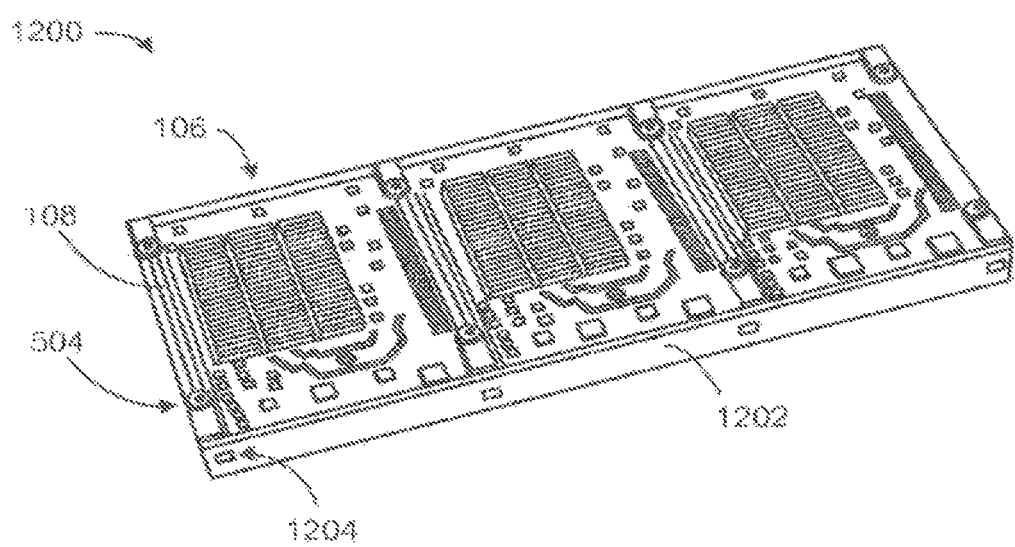
FIG. 13 is an exemplary isometric bottom view of the electronic assembly.

Referring now to FIG. 13, therein is shown an exemplary isometric bottom view of the electronic assembly 1200. The airflow bracket 802 of FIG. 8 can include the external cover 1202 around the circular rail 108 of FIG. 1 and the top board 104 of FIG. 1 and the bottom board 106.

The external cover 1202 is a mechanical structure forming an enclosure to create the thermal channel 101 of FIG. 1. The external cover 1202 can provide a top, bottom, and side barrier to air flow to direct the flow of air through the thermal channel 101.

The external cover 1202 can be configured in a variety of ways. For example, the external cover 1202 can be configured to cover the circular rail 108 and provide a solid top, bottom, and side wall.

In another example, the external cover 1202 can include a top side and two lateral sides while exposing the bottom board 106. In yet another example, the external cover 1202 can include the top side and two lateral sides having a bottom lip to fasten to the bottom board 106 while exposing the bottom board 106.

The external cover 1202 can be attached to the circular rail 108 in a variety of ways. For example, the external cover 1202 can include the cover holes 1204 for attaching to the circular rail 108. The locking tabs 502 of FIG. 5 can interlock with the cover holes 1204.

The external cover 1202 can be sized to form the airflow bracket 802 having extended length. For example, the external cover 1202 can be sized to cover three sets of the top board and the bottom board 106. The external cover 1202 can be configured to cover any number of sets of the top board 104 and the bottom board 106.

The external cover 1202 can expose the bottom board 106 and the bottom side of the circular rail 108. The circular rail 108 can include the mounting fasteners 504 for attaching the circular rail 108 to an external system.

It has been discovered that covering the airflow bracket 802 with the external cover 1202 can increase heat dissipation. By forming a continuous cover around the top board 104 and the bottom board 106, the external cover 1202 can direct air through the thermal channel and minimize lateral air leaks.

Figure 14:
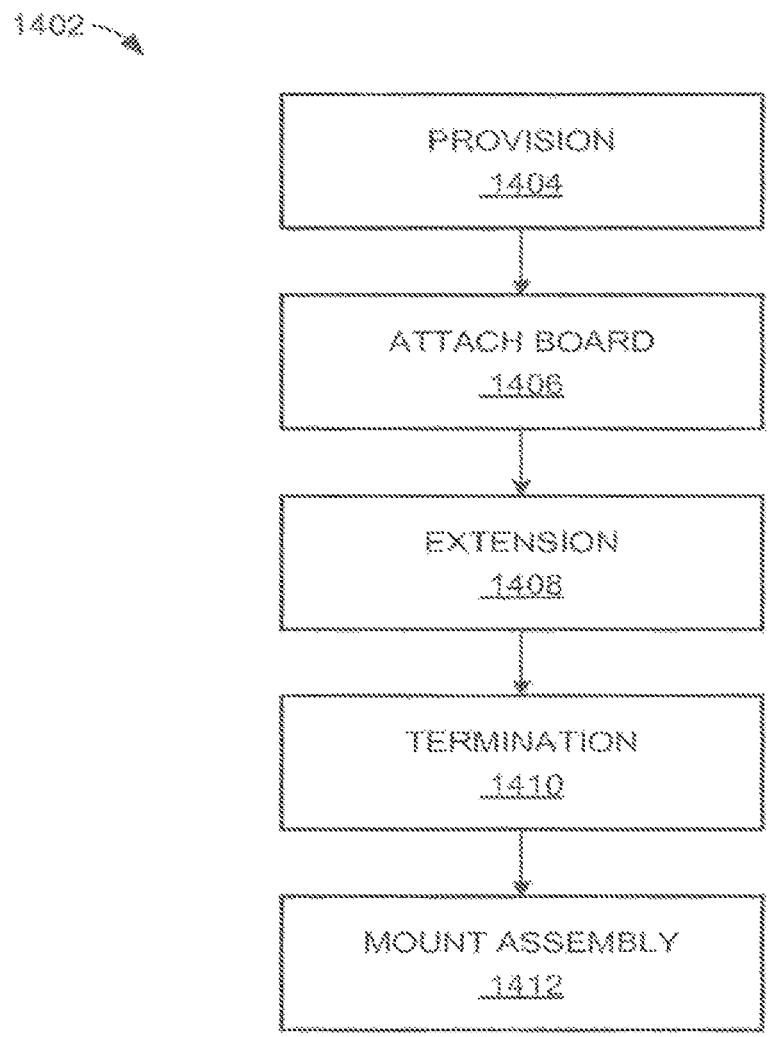
FIG. 14 is a process flow for manufacturing the electronic assembly.

Referring now to FIG. 14, therein is shown a process flow 1402 for manufacturing the electronic assembly 100 of FIG. 1. The process flow 1402 can include a provision step 1404, an attach board step 1406, an extension step 1408, a termination step 1410, and a mount assembly step 1412.

In the provision step 1404, the airflow bracket 802 of FIG. 8 having the circular rail 108 of FIG. 1 and the airflow tabs 110 of FIG. 1 can be provided. The circular rail 108 can have the inner top groove 506 of FIG. 5 and the inner bottom groove 508 of FIG. 5 for attaching to the top board 104 of FIG. 1 and the bottom board 106 of FIG. 1 respectively.

The airflow bracket 802 can include the airflow tabs 110 on both sides of the circular rail 108. The airflow tabs 110 can form a portion of the thermal channel 101 of FIG. 1 with the top board 104 and the bottom board 106 for directing air flow through the electronic assembly 100. In another illustrative example, the airflow bracket 802 can include only one of the airflow tabs 110. In yet another illustrative example, the thermal channel 101 can also be formed with only the top board 104 and the bottom board 106 with the side walls open.

In the attach board step 1406, the board duct unit 102 of FIG. 1 can be formed by attaching the top board 104 and the bottom board 106 to the circular rail 108 of the airflow bracket 802. The top board 104 can form the top side of the thermal channel 101. The bottom board 106 can form the bottom side of the thermal channel 101.

The top board 104 can be attached by inserting the top board 104 into the inner top groove 506 of the circular rail 108. The top board 104 can be held in the inner top groove 506 with an interference fit.

The top board 104 can be positioned between the airflow tabs 110. The top board 104 and the airflow tabs 110 can form a portion of the thermal channel 101 for directing air flow through the electronic assembly 100.

Optionally, the top board 104 and the inner top groove 506 of the circular rail 108 can be connected together with the board lock 704. The board lock 704 of FIG. 7 can be configured to match the front edge of the top board 104 with the inner top groove 506 to insure that only the top board 104 can be inserted into the inner top groove 506.

The circular rail 108 can be electrically connected to the top board 104 to allow the discharge of any accumulated static electric charge. For example, the circular rail 108 can be coupled to the ground plane of the top board 104, the surface of the top board 104, or a combination thereof.

The bottom board 106 can be attached by inserting the bottom board 106 into the inner bottom groove 508 of the circular rail 108. The bottom board 106 can be held in the inner bottom groove 508 with an interference fit.

Optionally, the bottom board 106 and the inner bottom groove 508 of the circular rail 108 can be connected together with the board lock 704. The board lock 704 can be configured to match the front edge of the bottom board 106 with the inner bottom groove 508 to insure that only the bottom board 106 can be inserted into the inner bottom groove 508.

The circular rail 108 can be electrically connected to the bottom board 106 to allow the discharge of any accumulated static electric charge. For example, the circular rail 108 can be coupled to the ground plane of the bottom board 106, the surface of the bottom board 106, or a combination thereof.

The bottom board 106 can be attached to the circular rail 108 with the bottom board 106 positioned to form the thermal channel 101 between the top board 104 and the bottom board 106 for directing air through the vent opening 116 of the circular rail 108. The thermal channel 101 can be defined by circular rail 108 attached to the bottom board 106 and the top board 104 with the top board 104 and the bottom board 106 positioned substantially parallel to one another. The thermal channel 101 can include a portion of the side walls formed by one or more of the airflow tabs 110.

The top board 104 and the bottom board 106 can be connected by the flexible interconnect 112 of FIG. 1. For example, the top board 104 and the bottom board 106 can be connected by attaching the flexible interconnect 112 to the top board 104 and the bottom board 106 after each of the boards has been attached to the circular rail 108. In another example, the top board 104 and the bottom board 106 can be connected by attaching the flexible interconnect 112 before the top board 104 and the bottom board 106 are attached to the circular rail 108.

The flexible interconnect 112 can be connected in a variety of ways. For example, the flexible interconnect 112 can be connected to the top board 104 and the bottom board 106 and positioned on the inner side of the airflow tabs 110 of the airflow bracket 802.

In another example, the flexible interconnect 112 can be connected to the top board 104 and the bottom board 106 and one of the airflow tabs 110 can be detached at the scoring groove 812 of FIG. 8. The flexible interconnect 112 can replace one of the airflow tabs 110 and act as a wall of the thermal channel 101 and direct the air flow thorough the electronic assembly 100.

In the extension step 1408, one of the board duct unit 102 can optionally be attached to another of the board duct unit 102 to form the electronic assembly 100 with extended length. It is understood that because of the modular nature of the system, any number of the board duct unit 102 can be attached to one another to form the electronic assembly 100 having arbitrary length.

The locking tab holes 810 of FIG. 8 of the circular rail 108 of another of the airflow bracket 802 can be attached to the locking tabs 502 of the circular rail 108 of the first of the airflow bracket 802. The locking tab holes 810 are sized to receive the locking tabs 502 of FIG. 5 and form a locking structure to hold elements in place relative to one another.

The tab extension 808 of FIG. 8 of the airflow tabs 110 of the first of the airflow bracket 802 can fit inside the tab notch 806 of FIG. 8 of another of the airflow bracket 802. The tab extension 808 and the tab notch 806 for an interlocking structure to hold the elements in place relative to one another.

The electronic assembly 100 can be extended by adding another of the board duct unit 102. The electronic assembly 100 can be extended by any number of units. For example, the electronic assembly 100 having extended length can include three of the board duct unit 102 to span the length of a printed circuit board card such as a PCI bus card.

It has been discovered that the electronic assembly 100 having extended length can increase the heat dissipation capacity by ducting air through the thermal channel 101. The air flowing through the thermal channel 101 can extract thermal energy from the top board 104 and the bottom board 106 and then exhaust the warmed air away from the electronic assembly 100. The circular rail 108, the airflow tabs 110, the top board 104, the bottom board 106, and the flexible interconnect 112 can form the thermal channel 101 for guiding the air flow.

In the termination step 1410, the last of the airflow tabs 110 of the electronic assembly 100 can terminated by attaching another one of the airflow bracket 802 having the airflow tabs 110 separated at the scoring groove 812. Separating the airflow tabs 110 at the scoring groove 812 leaves one of the circular rail 108 having the tab stub 1102 of FIG. 11.

Attaching the circular rail 108 having the tab stub 1102 to the end of the electronic assembly 100 can form the thermal channel 101 with the circular rail 108 on both ends. The thermal channel 101 having the circular rail 108 on both ends can guide the air flowing through the thermal channel 101 to exhaust the heated air from the system.

It has been discovered that terminating the electronic assembly 100 by attaching another one of the airflow bracket 802 having the airflow tabs 110 separated at the scoring groove 812 can increase heat dissipation capacity by eliminating leakage from the thermal channel 101 by holding the end of the thermal channel 101 together. Attaching the circular rail 108 to the airflow tabs 110 positions the airflow tabs 110 closely against the top board 104 and the bottom board 106 to prevent air leaks.

In the mount assembly step 1412, the electronic assembly 100 can be mounted to the external system 120 of FIG. 1. The mounting fasteners 504 of FIG. 5 of the circular rail 108 can be attached to the external system 120. For example, the mounting fasteners 504, such as screws, can be attached to the external system 120, such as a PCI card, and the circular rail 108 to mount the electronic assembly 100 securely to the PCI card.

It has been discovered that attaching the electronic assembly 100 to the external system 120 with the mounting fasteners 504 can increase reliability by providing heat dissipation from the electronic assembly 100 to the external system 120. The physical connection between the circular rail 108 of the electronic assembly 100 with the mounting fasteners 504 can provide a thermally conductive path to allow the dissipation of heat from the electronic assembly 100.

Figure 15:
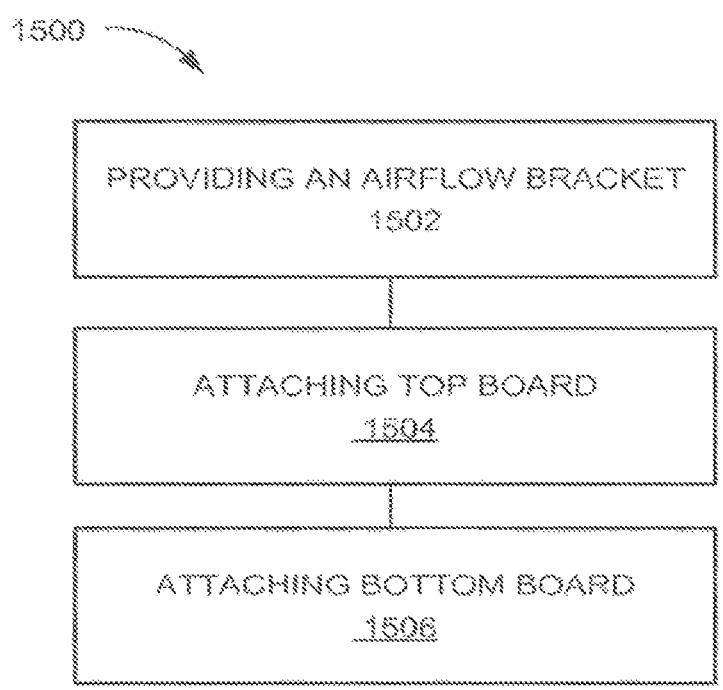
FIG. 15 is a flow chart of a method of manufacturing of the electronic assembly in a further embodiment of the present invention.

Referring now to FIG. 15, therein is shown a flow chart of a method 1500 of manufacturing of the electronic assembly 100 of FIG. 1 in a further embodiment of the present invention. The method 1500 includes: providing an airflow bracket having a circular rail and an airflow tab, the airflow bracket electrically coupling the circular rail and the airflow tab in a block 1502; attaching a top board to the circular rail for electrically coupling the top board and the circular rail in a block 1504; and attaching a bottom board to the circular rail for electrically coupling the bottom board and the circular rail, the bottom board positioned to form a thermal channel between the top board and the bottom board for directing air through a vent opening of the circular rail in a block 1506.

It has been discovered that the electronic assembly 100 of the present invention furnishes important and heretofore unknown and unavailable solutions, capabilities, and functional aspects for processing the component trays having electrical devices.

The resulting processes and configurations are straightforward, cost-effective, uncomplicated, highly versatile and effective, can be surprisingly and unobviously implemented by adapting known technologies, and are thus readily suited for efficiently and economically manufacturing semiconductor packages fully compatible with conventional manufacturing processes and technologies.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations that fall within the scope of the included claims. All matters set forth herein or shown in the accompanying drawings are to be interpreted in an illustrative and non-limiting sense.

In many implementations, two electronic boards (e.g., a top board 104 and a bottom board 106 in a board duct unit) are electrically coupled via an interconnect that carries electrical signals between these two electronic boards. As explained above with reference to FIG. 4, in one specific example, a flexible interconnect 112 is applied to couple the top board 104 and the bottom boards 106 in the board duct unit. In various implementations, flexible interconnect 112 includes a flexible substrate, for example made of flexible materials such as polymeric materials. Examples of flexible interconnect 112 include, but are not limited to, a flexible board, flexible wire array, flexible PCB, flexible flat cable, ribbon cable, and a combination thereof. In some implementations, flexible interconnect 112 replaces a first air flow tab 110 and faces a second air flow tab 110. In some other embodiments flexible interconnect 112 is provided in addition to first air flow tab 110, and faces second air flow tab 110. In some embodiments, flexible interconnect 112 acts as a wall of a thermal channel 101 to direct an air flow that passes through a vent opening formed by a rail 108.

Figure 16:
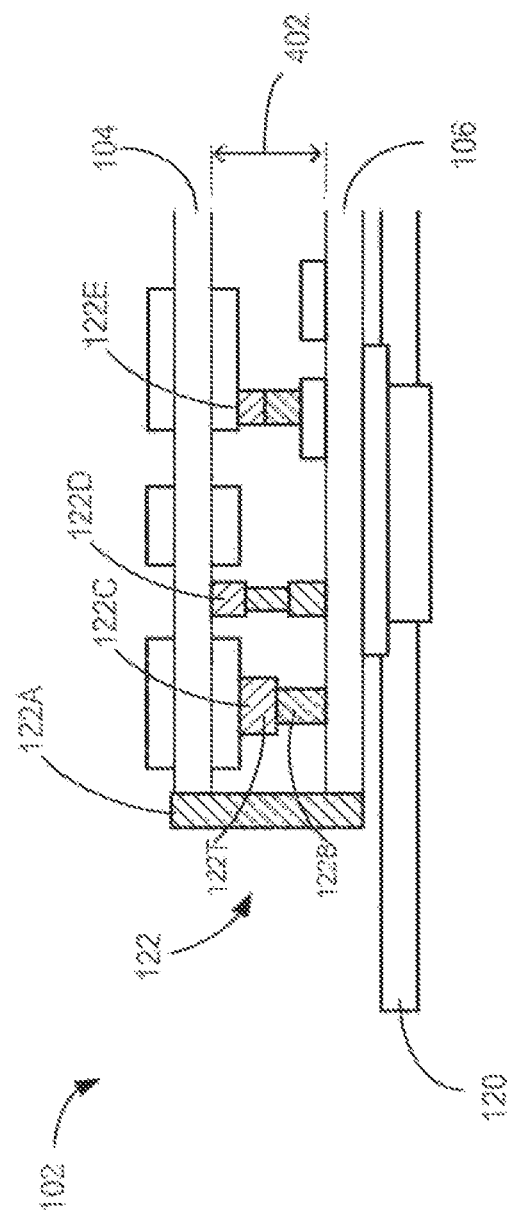
FIG. 16 illustrates an exemplary end view of a portion of a board duct unit that relies on at least one rigid interconnect to electrically couple two circuit boards in a board duct unit in accordance with some embodiments.

In some implementations, a rigid interconnect electrically and mechanically couples top board 104 to bottom board 106 in the board duct unit. FIG. 16 illustrates an exemplary end view of a portion of a board duct unit 102 that includes at least one rigid interconnect 122 (e.g., one or more of interconnects 122A and 122C-122E) to electrically couple two circuit boards in the board duct unit, in accordance with some embodiments. In some implementations, one or more of the interconnects 122 is positioned internally within the thermal channel. In some implementations, an internally positioned interconnect 122 is configured to disturb but not block air flow in the thermal channel. As a specific, non-limiting example, when the internally positioned interconnect contains a row of conductive pins, it is preferably oriented to substantially align with the airflow tabs and along the airflow direction.

Optionally, a respective rigid interconnect, such as rigid interconnect 122A, includes a single interconnect part that includes two electrical terminals, one electrically coupled to top board 104 and the other electrically couples to bottom board 106. Optionally, a respective rigid interconnect, such as rigid interconnect 122C, includes two complementary interconnect parts 122T and 122B, where interconnect part 122T is configured to connect to top board 104, and interconnect part 122B is configured to connect to bottom board 106. In addition, interconnect parts 122T and 122B are further pluggable to each other to form an electrical connection between the top and bottom boards. Optionally, a respective rigid interconnect, such as rigid interconnect 122D, includes a set of interconnect parts that has more than two interconnect parts. Two of these interconnect parts are configured to be coupled to top board 104 and bottom board 106, respectively, and furthermore the set of interconnect parts are configured to be assembled into a rigid interconnect that couples top board 104 to bottom board 106.

In some embodiments, the interconnect, whether implemented as interconnect 112 or interconnect 122, includes a plurality of parallel wires, conductive channels, or signal paths, between top board 104 and bottom board 106. In some embodiments, both ends of the interconnect comprise terminals. For example, in some embodiments, each terminal of rigid interconnect 122 includes a plurality of conductive pins that are assembled on an insulating housing of rigid interconnect 122. Each respective terminal of rigid interconnect 122 is optionally configured to be connected to a corresponding circuit board via surface mounting technology or through-hole technology. In some embodiments, conductive pins of the respective terminals are configured to be soldered to conductive pads or via holes that are coated with conductive materials on the corresponding circuit board, thereby forming mechanical and electrical connections with the circuit board.

In some embodiments, the height of rigid interconnect 122 is commensurate with separation distance 402, which is the distance between the top board 104 and the bottom board 106. Furthermore, in some embodiments, the height of rail 108 is also commensurate with separation distance 402 and/or the height of rigid interconnect 122.

Optionally, rigid interconnect 122 (e.g., interconnect 122A) is attached to respective sides of top board 104 and bottom board 106, and optionally faces an airflow tab attached to opposite sides of the boards. Optionally, rigid interconnect 122 (e.g., interconnect 122C, 122D or 122E) is attached to respective inner regions of top board 104 and bottom board 106. In some implementations, two terminals of rigid interconnect 122 (e.g., interconnect 122D) are directly mounted on top board 104 and bottom board 106. In some implementations, one terminal of rigid interconnect 122 (e.g., interconnect 122B) is attached indirectly to a circuit board via an electronic part that is already mounted on the circuit board. In some implementations, both terminals of rigid interconnect 122 (e.g., interconnect 122E) are attached indirectly to top board 104 and bottom board 106 via a respective electronic part that is already mounted on the corresponding circuit board. In some implementations, rigid interconnect 122 is instead a semi-rigid interconnect.

It is noted that an interconnect that electrically couples top board 104 and bottom board 106 may also include both a flexible interconnect part and a rigid interconnect part. As a specific example, a rigid interconnect part is coupled to top board 104 at one end and to a flexible interconnect part at the other end, and the flexible interconnect part further connects to bottom board 106 or to another rigid interconnect that connects to bottom board 106.

Figure 17:
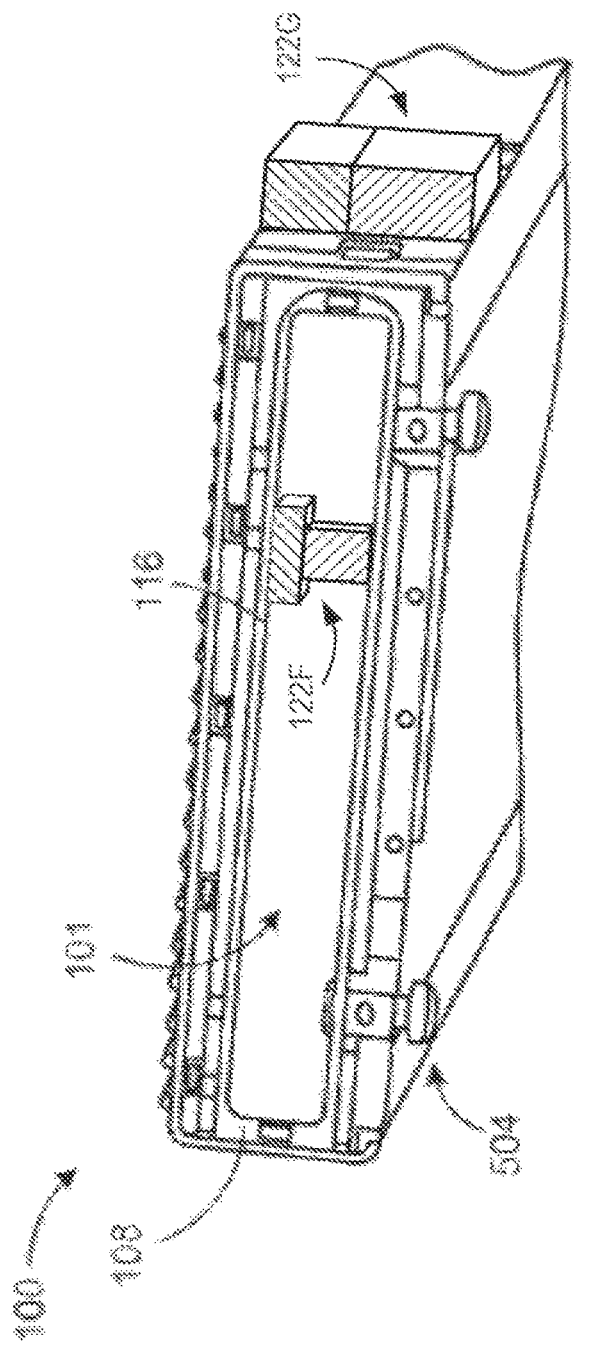
FIG. 17 illustrates an exemplary front view of an electronic assembly that relies on a rigid interconnect to electrically couple two circuit boards in a board duct unit in accordance with some embodiments.

FIG. 17 illustrates an exemplary front view of an electronic assembly 100 that includes a rigid interconnect to electrically couple two circuit boards in a board duct unit in accordance with some embodiments. As shown in FIG. 17, board duct unit 102 in electronic assembly 100 includes rail 108 having a vent opening 116, and optionally includes air flow tab(s) 110, and further optionally includes mounting fasteners 504. In some embodiments, top board 104, bottom board 106, and air flow tab(s) 110 are attached to rail 108 via locking tabs 502 and grooves 506-512 as shown above in FIG. 5. In some embodiments, rail 108, rigid interconnect 122 and airflow tab(s) 110 constitute a subassembly that mechanically and electrically couples top board 104 to bottom board 106. In some implementations, the entire electronic assembly 100 is further attached to an external system via mounting fasteners 504.

In some implementations, as shown in FIG. 17, a respective rigid interconnect 122 (e.g., interconnect 122F) is attached to respective inner regions of top board 104 and bottom board 106 and carries electrical signals between top board 104 and bottom board 106. In some of these implementations, the electronic assembly (or a board duct unit of the electronic assembly) also includes one or two air flow tabs 110 (see FIGS. 1, 9, and 10, for example), positioned on one or both respective sides of thermal channel 101, to constraint air flow between the top and bottom boards.

In some embodiments, a respective rigid interconnect 122 (e.g., interconnect 122G) is positioned at or substantially close to respective edges of top board 104 and bottom board 106. In one example, the rigid interconnect extends substantially the entire length of the board duct unit, or substantially the length of the entire top board 104 and/or bottom board 106. As noted above, in some embodiments, a respective rigid interconnect 122 is used in place of a corresponding air flow tab 110 to control or direct air flow between top board 104 and bottom board 106. In some embodiments, however, a respective rigid interconnect 122 has a length substantially shorter than the length of the board duct unit 102, or substantially shorter than the length of the top board 104 and/or bottom board 106.

Figure 18:
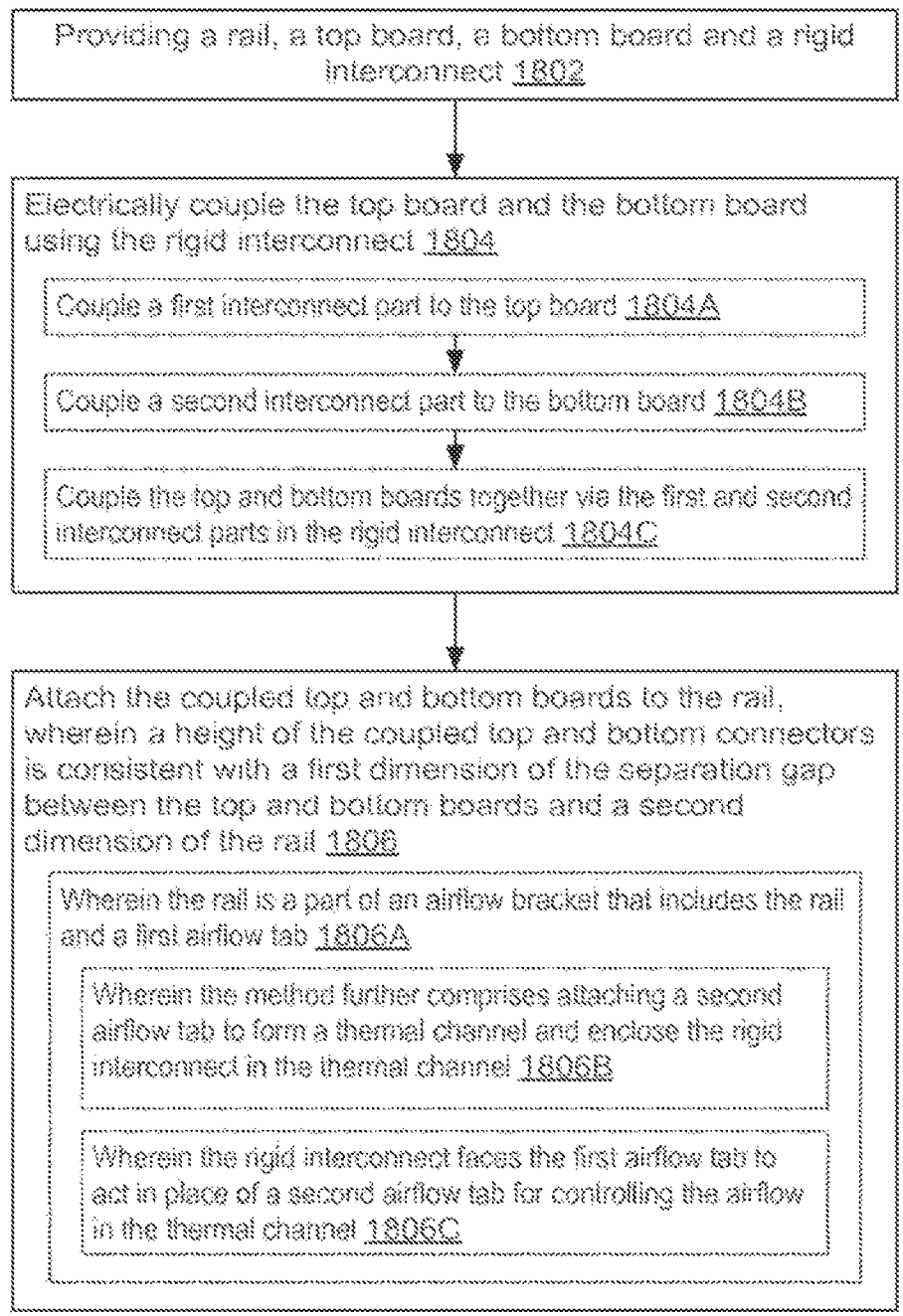
FIG. 18 illustrates an exemplary flow chart of a method for assembling a board duct unit that relies on an interconnect to electrically couple two circuit boards in accordance with some embodiments.

FIG. 18 illustrates an exemplary flow chart of a method 1800 for assembling a board duct unit that includes an interconnect to electrically couple two circuit boards, in accordance with some embodiments. In some implementations, a rail, a top board, a bottom board and an interconnect are provided (1802) for assembling a board duct unit that is integrated, or is configured to be integrated, in an electronic assembly as shown in FIG. 1. In some embodiments, the interconnect is a rigid interconnect, as described above. In some embodiments, the interconnect is a flexible interconnect. In some implementations, the rail has a rectangular frame, but is nonetheless sometimes referred to as a "circular rail" because it includes a vent opening having a round shape or a rounded rectangular shape.

The method includes electrically coupling the top board and the bottom board (1804) using the interconnect. The interconnect, whether rigid or flexible, is used to carry electrical signals between electronic components on these two boards. In some embodiments, the interconnect is a rigid interconnect, and the top and bottom boards are successively bonded to two terminals of the rigid interconnect. In some embodiments, the rigid interconnect includes two or more interconnect parts, which are used together to couple the top and bottom boards. In some such embodiments, a first interconnect part is coupled (1804A) to the top board, and a second interconnect part is coupled (1804B) to the bottom board. The top and bottom boards are further coupled (1804C) together via at least the first and second interconnect parts in the rigid interconnect. As a result, the top and bottom boards are mechanically and electrically coupled to each other.

The method further includes attaching (1806) the coupled top and bottom boards to the rail. A height of the coupled top and bottom boards is consistent with a first dimension of the separation gap between the top and bottom boards and a second dimension of the rail, where the height, the first dimension and the second dimension are measured along a separation of the top and bottom boards. In some implementations, the coupled top and bottom boards are received by the rail along its inner top and bottom grooves as shown above in FIG. 5.

In many implementations, the rail is a part of an air flow bracket that includes (1806A) the rail and a first air flow tab. In some implementations, the method includes forming the thermal channel between the top and bottom boards by (1806B) attaching a second air flow tab to form the thermal channel between the top and bottom boards. As air flow passes through the rail, and is further directed by the top board, the bottom board, and the first and second air flow tabs. As such, the air flow carries away heat generated by and dissipated from electronic components on the top and bottom boards.

In some implementations, the rigid interconnect faces (1806C) the first airflow tab to act in place of a second airflow tab for controlling the air flow in the thermal channel. In some other implementations, two rigid interconnects face each other to act in place of both the first airflow tab and the second airflow tab. Under some circumstances, these rigid interconnects are positioned at edges of the boards or substantially close to the corresponding edges, and extend substantially the entire length of the boards.

It should be understood that the particular order in which the operations in FIG. 18 have been described are merely exemplary and are not intended to indicate that the described order is the only order in which the operations could be performed. Additionally, it should be noted that details of other processes described above with respect to methods 1402 and 1500 (e.g., FIGS. 14 and 15) are also applicable in an analogous manner to method 1800 described herein with respect to FIG. 18. For brevity, these details are not repeated here.

The foregoing description has been provided with reference to specific embodiments. However, the illustrative discussions above are not intended to be exhaustive or to be limiting to the precise forms disclosed. Many modifications and variations are possible in view of the above teachings. The embodiments were chosen and described in order to best explain the principles disclosed and their practical applications, to thereby enable others to best utilize the disclosure and various embodiments with various modifications as are suited to the particular use contemplated.

What is claimed is:

1. A method of manufacturing of an electronic assembly comprising:
   providing an airflow bracket comprising a rail and an airflow tab attached to and extending from the rail and forming an air barrier, the rail and the airflow tab each at least partially made of a respective conductive material and electrically coupled via the respective conductive material of the rail and the respective conductive material of the airflow tab to discharge, to an external ground, static electricity on the airflow tab and rail resulting from airflow through the electronic assembly;
   attaching a top board to the rail for electrically coupling a ground of the top board and the rail; and
   attaching a bottom board to the rail for electrically coupling a ground of the bottom board and the rail, the bottom board and the airflow tab positioned to form a thermal channel between the top board and the bottom board and to direct air through a vent opening of the rail.

2. The method of claim 1, wherein attaching the top board includes attaching the top board to an inner top groove of the rail.

3. The method of claim 1, wherein attaching the bottom board includes attaching the bottom board to an inner bottom groove of the rail.

4. The method of claim 1, further comprising attaching the airflow tab to a locking tab of the rail for extending the thermal channel.

5. The method of claim 1, further comprising coupling a mounting fastener to the rail for grounding the rail to an external system.

6. A method of manufacturing of an electronic assembly comprising:
   providing an airflow bracket comprising a vent opening and a respective side;
   attaching a top circuit board to a top side of the airflow bracket;
   attaching a bottom circuit board to a bottom side of the airflow bracket, the bottom circuit board facing the top circuit board, the top circuit board and the bottom circuit board positioned to form a thermal channel between the top circuit board and the bottom circuit board for directing air flowing through the vent opening of the airflow bracket, wherein the respective side of the airflow bracket forms a first side of the thermal channel; and
   attaching a flexible interconnect between the top circuit board and the bottom circuit board, wherein the flexible interconnect electrically couples the top circuit board with the bottom circuit board to carry electrical signals between the top circuit board and the bottom circuit board, and wherein the flexible interconnect extends along substantially a full length of a respective edge of the top circuit board and the bottom circuit board, and forms a second closed side of the thermal channel facing the first side of the thermal channel so as to retain in the thermal channel, the directed air flowing through the vent opening in the airflow bracket, wherein the thermal channel is formed by the respective side of the airflow bracket, the top and bottom circuit boards, and the flexible interconnect.

7. The method of claim 6, further comprising attaching an external cover around the airflow bracket for forming the thermal channel.

8. The method of claim 6, wherein the airflow bracket includes a rail that includes the vent opening, the method further comprising attaching an external cover with a locking tab of the rail within a locking tab hole of the external cover for forming the thermal channel.

9. The method of claim 6, wherein attaching the top circuit board includes attaching the top circuit board to an outer top groove of a rail of the airflow bracket for extending the thermal channel.

10. The method of claim 6, wherein attaching the bottom circuit board includes attaching the bottom circuit board to an outer bottom groove of a rail of the airflow bracket for extending the thermal channel.

11. An electronic assembly comprising:
    an airflow bracket comprising a rail and an airflow tab coupled to the rail attached to and extending from the rail and forming an air barrier, the rail including a vent opening, the rail and the airflow tab each at least partially made of a respective conductive material and electrically coupled via the respective conductive material of the rail and the respective conductive material of the airflow tab to discharge, to an external ground, static electricity on the airflow tab and rail resulting from airflow through the electronic assembly;
    a top circuit board attached to the rail, a ground of the top circuit board electrically coupled to the rail; and
    a bottom circuit board attached to the rail, a ground of the bottom circuit board electrically coupled to the rail, the top circuit board and the airflow tab positioned to form a thermal channel between the top circuit board and the bottom circuit board for directing air through the vent opening of the rail.

12. The assembly of claim 11, wherein the top circuit board is attached to an inner top groove of the rail.

13. The assembly of claim 11, wherein the bottom circuit board is attached to an inner bottom groove of the rail.

14. The assembly of claim 11, wherein the airflow tab is attached to a locking tab of the rail for extending the thermal channel.

15. The assembly of claim 11, further comprising a mounting fastener coupled to the rail for grounding the rail to an external system.

16. The assembly of claim 11, further comprising:
    a flexible interconnect attached between the top circuit board and the bottom circuit board to carry electrical signals between the top circuit board and the bottom circuit board.

17. The assembly of claim 16, further comprising an external cover around the airflow bracket for forming the thermal channel.

18. The assembly of claim 16, further comprising an external cover for forming the thermal channel, the external cover including a locking tab hole, wherein a locking tab of the rail couples to the locking tab hole of the external cover.

19. The assembly of claim 16, wherein the top circuit board is attached to an outer top groove of another of the rail for extending the thermal channel.

20. The assembly of claim 16, wherein the bottom circuit board is attached to an outer bottom groove of the rail for extending the thermal channel.

21. The assembly of claim 16, wherein the flexible interconnect is configured to channel the air directed through the vent opening of the rail.

22. The assembly of claim 11, further comprising:
an interconnect attached between the top circuit board and the bottom circuit board to carry electrical signals between the top circuit board and the bottom circuit board and configured to channel the air directed through the vent opening of the rail.

23. An electronic assembly comprising:
a top circuit board;
a bottom circuit board; and
a subassembly comprising:
   a rail comprising a vent opening through which air can be directed;
   an airflow tab mechanically coupled to the top circuit board and the bottom circuit board, the bottom circuit board facing the top circuit board, the airflow tab forming a first side of a thermal channel for directing air flowing through the vent opening of the rail, and the top circuit board and the bottom circuit board forming other sides of the thermal channel; and
   a flexible interconnect facing the airflow tab, wherein the interconnect is attached between the top circuit board and the bottom circuit board to carry electrical signals between the top circuit board and the bottom circuit board, and wherein the flexible interconnect extends along substantially a full length of a respective edge of the top circuit board and the bottom circuit board and forms a second closed side of the thermal channel that is separate from and facing the first side of the thermal channel so as to retain in the thermal channel, the directed air flowing through the vent opening of the rail, wherein the thermal channel is formed by the airflow tab, the top and bottom circuit boards, and the flexible interconnect.

24. The electronic assembly of claim 23, further comprising an external cover that is attached around the subassembly.

* * * * *